United States Patent
Song et al.

(10) Patent No.: US 7,879,725 B2
(45) Date of Patent: Feb. 1, 2011

(54) STRIPPING COMPOSITION FOR REMOVING A PHOTORESIST AND METHOD OF MANUFACTURING TFT SUBSTRATE FOR A LIQUID CRYSTAL DISPLAY DEVICE USING THE SAME

(75) Inventors: Keun-Kyu Song, Yongin-si (KR); Nam-Seok Roh, Seongnam-si (KR); Mun-Pyo Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 353 days.

(21) Appl. No.: 10/538,511

(22) PCT Filed: Dec. 5, 2003

(86) PCT No.: PCT/KR03/02660

§ 371 (c)(1),
(2), (4) Date: Jun. 9, 2005

(87) PCT Pub. No.: WO2004/053970

PCT Pub. Date: Jun. 24, 2004

(65) Prior Publication Data

US 2006/0046361 A1  Mar. 2, 2006

(30) Foreign Application Priority Data

Dec. 9, 2002  (KR) ............... 10-2002-0078016

(51) Int. Cl.
*H01L 21/311* (2006.01)
(52) U.S. Cl. ............... 438/694; 438/695; 257/E21.026
(58) Field of Classification Search ......... 438/694–695; 257/26
See application file for complete search history.

(56) References Cited

U.S. PATENT DOCUMENTS

| 6,699,330 B1 * | 3/2004 | Muraoka ............... 134/3 |
| 6,846,529 B2 * | 1/2005 | Mohan et al. ......... 428/34.2 |
| 6,864,529 B2 * | 3/2005 | Mei et al. ............. 257/315 |

(Continued)

FOREIGN PATENT DOCUMENTS

| EP | 1 088 603 A1 | 4/2001 |
| JP | 2001-345304 | 12/2001 |
| JP | 2001-351893 | 12/2001 |
| KR | 1020000050361 A | 8/2000 |
| KR | 2001-0039947 | 5/2001 |

*Primary Examiner*—Thao X Le
*Assistant Examiner*—Elias Ullah
(74) *Attorney, Agent, or Firm*—Cantor Colburn LLP

(57) ABSTRACT

In a stripping composition for easily removing a photoresist without an adverse effect and a method of manufacturing a TFT substrate for an LCD device using the same, the stripping composition includes acetic acid and ozone gas contained in the acetic acid as a bubble form to remove the photoresist including novolak. A photoresist pattern including novolak is formed on a predetermined layer (24) formed on a substrate (10). The layer is etched using the photoresist pattern as a mask to form a pattern of the layer. The photoresist pattern is removed using the stripping composition. The stripping composition is cheap and more effectively protects the environment in comparison with the conventional stripping compositions. Additionally, an $O_2$ ashing process performed before or after a stripping process may be omitted to thereby simplify a stripping process.

13 Claims, 36 Drawing Sheets

U.S. PATENT DOCUMENTS

| | | |
|---|---|---|
| 6,982,006 B1 * | 1/2006 | Boyers et al. .................. 134/3 |
| 2002/0011257 A1 * | 1/2002 | Degendt et al. ................ 134/3 |
| 2002/0066717 A1 | 6/2002 | Verhaverbeke et al. |
| 2002/0088478 A1 * | 7/2002 | Degendt et al. ................ 134/3 |
| 2002/0132451 A1 * | 9/2002 | Akino et al. ................ 438/478 |
| 2002/0149050 A1 * | 10/2002 | Fazio et al. ................ 257/314 |
| 2002/0173156 A1 * | 11/2002 | Yates et al. ................ 438/695 |
| 2003/0108823 A1 | 6/2003 | Muraoka et al. |

* cited by examiner

STRIPPING COMPOSITION FOR REMOVING A PHOTORESIST AND METHOD OF MANUFACTURING TFT SUBSTRATE FOR A LIQUID CRYSTAL DISPLAY DEVICE USING THE SAME

TECHNICAL FIELD

The present invention relates to a stripping composition for removing a photoresist and a method of manufacturing a thin film transistor (TFT) substrate of a liquid crystal display (LCD) device using the same. More particularly, the present invention relates to a stripping composition for easily removing a photoresist with a reduced adverse effect, and a method of manufacturing a TFT substrate for an LCD device using the stripping composition.

BACKGROUND ART

Electronic display apparatuses are important in a recent information society, and the electronic display apparatuses are used in various fields. Various electronic display apparatuses have been improved to meet various demands of the information society.

An electronic display apparatus displays various pieces of information so that a user easily recognizes the information through the electronic display apparatus. That is, the electronic display apparatus converts an electronic data signal outputted from an electronic apparatus into a light data signal that is perceivable by a user's eyesight. The electronic display apparatus serves a bridge between the user and the electronic apparatus.

The electronic display apparatuses are generally divided into an emissive display apparatus and a non-emissive display apparatus. The emissive display apparatus displays a light data signal utilizing a light luminescence mechanism, while the non-emissive display apparatus displays a light data signal employing light modulation mechanism such as reflection mechanism, diffusion mechanism, interference mechanism, etc. The emissive display apparatus, called as an active luminescent apparatus, includes a cathode ray tube (CRT), a plasma display panel (PDP), a light emitting diode (LED) and an electro luminescent display (ELD). The non-emissive display apparatus, called as a passive luminescent apparatus, includes an LCD, an electrochemical display (ECD) and an electrophoretic image display (EPID) apparatus.

The CRT is used in a television receiver set or a monitor for a computer. Although the CRT has high display quality and low cost, the CRT has heavy weight, large volume and large power consumption.

Electronic apparatus has been improved to have compact and small dimension, light weight and lower power consumption in accordance with the rapid improvement of semiconductor technology.

The LCD apparatus has some advantages such as a thinner thickness and a lighter weight than other flat display apparatuses, and also the LCD apparatus operates with low power consumption and low driving voltage. In addition, the LCD apparatus has high display quality and low manufacturing cost so that the LCD apparatus has been widely used in various fields.

The LCD apparatus may be easily manufactured using a proper photoresist composition for forming a photoresist film that determines the yield of a microcircuit. A quality of the microcircuit manufactured by an etching process is directly affected by the sensitivity, the developing contrast, the resolution, the adhesiveness to a substrate and the remnant characteristics of the photoresist film.

In order to form a pattern according to a conventional method, a photoresist film including organic material is formed on a substrate including an insulation film or a conductive film formed thereon. When the photoresist film formed on the substrate is exposed by ultraviolet or X ray, the solubility of the photoresist film against alkali solution is changed. When the photoresist film is exposed using a mask, a predetermined portion of the photoresist film is exposed. When the exposed portion of the photoresist film is developed, the portion of the photoresist film having relatively larger solubility is removed to thereby form a photoresist pattern exposing the portion of the insulation film or the conductive film. The exposed portion of the insulation film or the conductive film is etched to form an insulation film pattern or a conductive pattern on the substrate. The remaining photoresist pattern is then removed using an ashing or a stripping process. Thus, the insulation film pattern or the conductive pattern serving a wiring or an electrode is formed on the substrate.

There is disclosed one conventional photoresist composition including a novolak of cresol-formaldehyde and photosensitive material substituted by naphthoquinonediazide in U.S. Pat. Nos. 3,046,118, 4,115,128, 4,173,470 or Japanese Laid Open Publication No. 62-28457. Additionally, there is provided another conventional photoresist composition having soluble alkali resin, o-naphthoquinonediazide sulfonic ester and vinyl ether compound in U.S. Pat. No. 5,648,194. Further, still another conventional photoresist composition including soluble alkali resin and formed using quinonediazide compound and polymer of polyphenol is disclosed in U.S. Pat. No. 5,468,590. Still another conventional photoresist composition of improved characteristics having novolak, quinonediazide and polyphenol is disclosed in U.S. Pat. No. 5,413,895.

After the insulation or the conductive pattern is formed on the substrate, the photoresist pattern is removed using a stripping composition including an organic solvent or an alkali solution. The organic solvent is widely employed since it efficiently removes the photoresist pattern while it does not erode the pattern or the substrate. However, the organic solvent is expensive as well as the organic solvent may cause a serious pollution.

DISCLOSURE OF THE INVENTION

Accordingly, it is one feature of the present invention to provide a stripping composition for efficiently removing a photoresist residue without causing an environmental pollution.

It is another feature of the present invention to provide a method of forming a pattern using the stripping composition for efficiently removing a photoresist pattern.

It is still another feature of the present invention to provide a method of simply manufacturing the TFT substrate of an LCD device using the stripping composition during relatively short manufacturing time.

In accordance with one aspect on the invention, the stripping composition for removing a photoresist residue includes acetic acid and ozone gas included in the acetic acid as a bubble form.

In accordance with another aspect of the invention, a photoresist pattern including novolak is formed on a predetermined layer that is formed on a substrate. The layer is etched to form a layer pattern using the photoresist pattern as an etching mask. The photoresist pattern is removed using a stripping composition including acetic acid and ozone gas contained in the acetic acid as a bubble form.

In accordance with still another aspect of the invention, a first gate wiring layer and a second gate wiring layer are formed on a substrate. A first photoresist pattern including novolak is formed on the gate wiring layers. The second gate wiring layer is etched using the first photoresist pattern as a mask. The first photoresist pattern is removed using a stripping composition including acetic acid and ozone gas included in the acetic acid as a bubble form. The first gate wiring layer is etched to form a gate pattern having a gate line, a gate pad and a gate electrode. A gate insulation layer is formed on the substrate. A semiconductor layer pattern and an ohmic contact pattern are formed after forming a semiconductor layer and a doped amorphous silicon layer on the gate insulation layer. A data line, a source electrode and a drain electrode are formed by etching a conductive material formed on the semiconductor layer. A second photoresist pattern including novolak is formed on a passivation layer after the passivation layer is formed on the data line, the source electrode and the drain electrode. The passivation layer includes an organic film. The passivation layer is etched to form a contact hole exposing the portion of the drain electrode. The second photoresist pattern is removed using a stripping composition including acetic acid and ozone gas contained in the acetic acid as a bubble form. Transparent conductive material is formed and etched to form a pixel electrode.

In the method of manufacturing the TFT substrate for an LCD device, a gate pattern having a gate line, a gate pad and a gate electrode is formed on a substrate. A gate insulation layer is formed on the substrate. A semiconductor layer, an intermediate layer and a conductive layer are formed on the gate insulation layer. A photoresist film including novolak is formed on the conductive layer. The photoresist film is exposed and developed to form a photoresist pattern. The photoresist pattern includes a first region formed in a channel region between a source electrode and a drain electrode, and a second region formed in a data wiring region. The first region has a thickness thinner than that of the second region. The semiconductor layer, the intermediate layer and the conductive layer are etched so that a semiconductor layer pattern is formed in the channel region and the semiconductor layer pattern, an intermediate layer pattern and a conductive layer pattern are formed in the data wiring region. The photoresist pattern is removed using a stripping composition including acetic acid and ozone gas contained in the acetic acid as a bubble form. A contact hole exposing the portion of the drain electrode is formed through a passivation layer after forming the passivation layer on the data line, the source electrode and the drain electrode. The passivation layer may include an organic film. Transparent conductive material layer is formed and etched to form a pixel electrode.

In the method of manufacturing the TFT substrate for an LCD device, a data wiring having data line is formed on an insulation substrate. A red color filter, a green color filter and a blue color filter are formed on the substrate. A buffer layer is formed to cover the data wiring and the color filters. A gate wiring layer is formed on the buffer layer. A photoresist pattern including novolak is formed on the gate wiring layer. The gate wiring layer is etched to form a gate wiring having a gate line and a gate electrode using the photoresist pattern as a mask. The photoresist pattern is removed using a stripping composition including acetic acid and ozone gas included in the acetic acid as a bubble form. A gate insulation layer covering the gate wiring is formed. Patterns of an ohmic contact layer and a semiconductor layer are formed on the gate insulation layer, and a first contact hole exposing the portion of the data line is simultaneously formed through the gate insulation layer and the buffer layer. The ohmic contact layer has an island shape. A pixel wiring including a source electrode, a drain electrode and a pixel electrode is formed. The source electrode and the drain electrode may be formed using material substantially identical to that of the ohmic contact layer pattern. The drain electrode is separated from the source electrode. The pixel electrode is connected to the drain electrode. The exposed portion of the ohmic contact layer pattern between the source electrode and the drain electrode is removed so that the ohmic contact layer pattern is divided into two parts.

Therefore, when the stripping composition of the present invention is used to remove the remaining photoresist pattern on a substrate after etching process, the photoresist pattern is easily removed without an adverse effect. The stripping composition of the invention is cheap, and more effectively protects the environment in comparison with the conventional stripping compositions such as an organic solvent or an alkali solution. Additionally, an $O_2$ ashing process performed before or after a stripping process may be omitted to thereby simplify the stripping process because the stripping composition includes acetic acid and ozone gas.

BRIEF DESCRIPTION OF THE DRAWINGS

The above features and other advantages of the present invention will become more apparent with reference to the following detailed description when considered in conjunction with the accompanying drawings wherein.

BEST MODES FOR CARRYING OUT THE INVENTION

Figure 1:
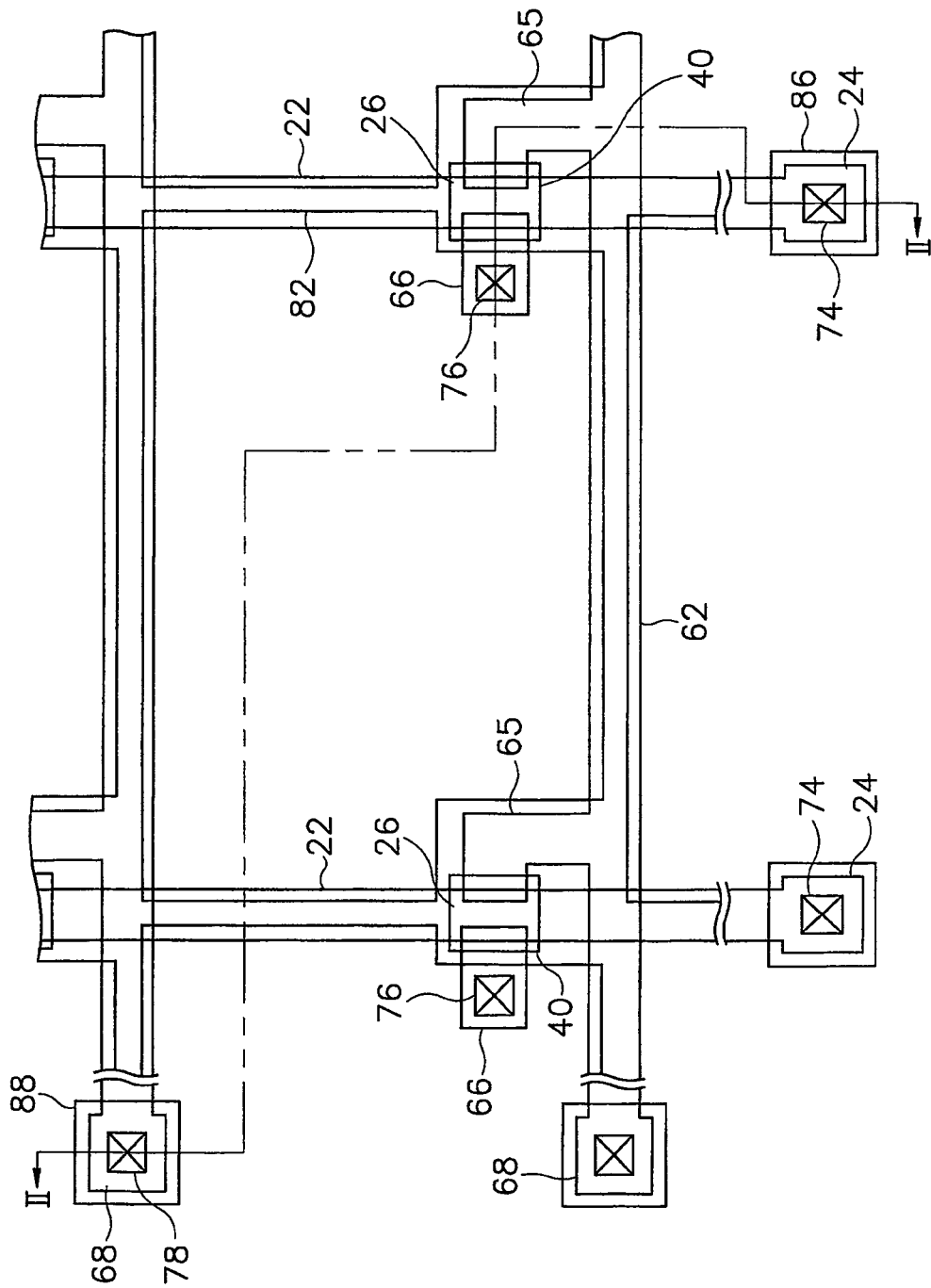
FIG. 1 is a schematic plan view illustrating a TFT substrate for an LCD apparatus according to one embodiment of the present invention.

A photoresist composition generally includes a high molecular (or polymer) resin, a photosensitive compound, an organic solvent, etc. Preferably, the high molecular resin includes novolak resin. The novolak resin corresponds to a soluble alkali resin, and the novolak resin may be employed for a positive photoresist. Aromatic alcohol and aldehydes are reacted with an acid catalyst to thereby form the novolak resin in accordance with a polymerization mechanism. The aromatic alcohol includes meta-cresol and/or para-cresol.

Examples of phenols include phenol, cresols, xylenols, alkyl phenols, alkoxy phenols, isopropenyl phenols, polyhydroxy phenols and a mixture thereof. Examples of the cresols may include m-cresol, p-cresol or o-cresol.

Examples of the aldehydes may include formaldehyde, paraformaldehyde, acetaldehyde, propionaldehyde, butylaldehyde, trimethylaldehyde, benzaldehyde, terephthalaldehyde, phenylaldehyde, hydroxybenzaldehyde and a mixture thereof. Preferably, the aldehydes include formaldehyde.

The acid catalyst employed in the polymerization mechanism includes inorganic acids and organic acids. Examples of the inorganic acids include hydrochloric acid, sulfuric acid, phosphoric acid, etc. Examples of the organic acids include acetic acid, p-tolune sulfonic acid, oxalic acid, etc. Preferably, the acid catalyst is oxalic acid. The polymerization is accomplished at a temperature of about 60 to about 120° C. for about 20 to about 30 hours.

The photoresist pattern is formed using an exposure process, a developing process and a hard-baking process. The hard-baking process is performed after the exposure and developing processes. When a substrate is hard-baked, the photoresist pattern flows by heat. The thermal flow of the photoresist pattern is prevented according to the concentration control of metacresol and paracresol or the molecular weight control of the polymerized high polymer.

The photoresist composition may include diazides compound. Polyhydroxy benzophenone is reacted with the diazides compound to form the photoresist compound. Examples of the diazides compound may include 1,2-naphthoquinonediazide, 2-diazo-1-naphthol-5-sulfonic acid, etc. Preferably, the polyhydroxy benzophenone is 2,3,4,4'-tetrahydroxy benzophenone, and the diazides compound is formed by esterification of the 1,2-naphthoquinonediazide, such as 2,3,4,4'-tetrahydroxybenzophenone-1,2-naphthoquinonediazide-4-sulfonate, 2,3,4,4'-tetrahydroxybenzophenone-1,2-naphthoquinonediazide-5-sulfonate, 2,3,4,4'-tetrahydroxybenzophenone-1,2-naphthoquinonediazide-6-sulfonate, etc.

The photoresist composition is coated on a substrate to form a photoresist film, and then the photoresist film is dried. The photoresist composition includes the high molecular resin and the photoresist compound. The photoresist film is exposed using a photo mask and developed. The exposed portion of the photoresist film is soluble relative to a predetermined solvent, and an unexposed portion of the photoresist film is insoluble so that the exposed portion of the photoresist film is removed by the developing. Therefore, a photoresist pattern is formed on the substrate.

According to the present invention, a stripping composition includes acetic acid and ozone gas. The photoresist pattern is removed by using the stripping composition prepared by the following formula. The photoresist composition preferably includes a novolak resin and a photoresist compound. The novolak resin is formed using formaldehyde and cresol. The photoresist compound includes diazid compound that is formed by 2-diazo-1-naphthol-5-sulfonic acid. The photoresist pattern is decomposed using the ozone gas according to the following formula.

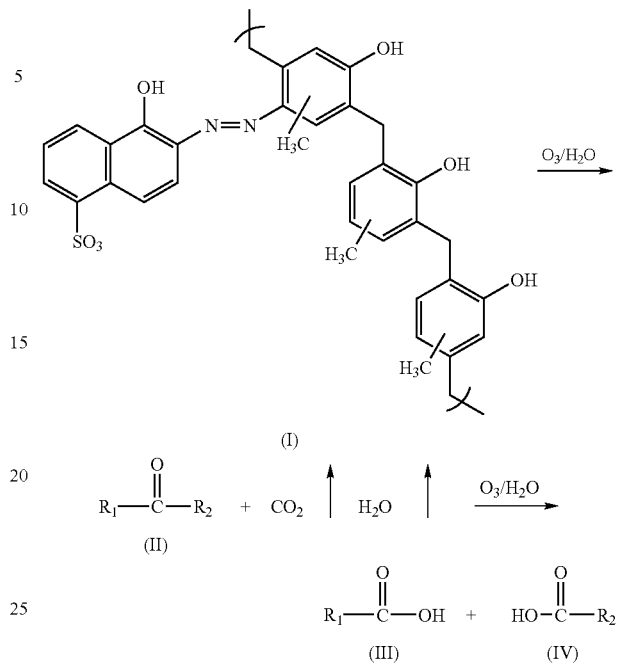

When the compound I is exposed to the stripping composition, the compound I is decomposed into the compound II, carbon dioxide and water vapor using an activated radical or a positive ion. The compound I corresponds to a photoresist including novolak, the compound II includes a ketone compound and an aldehyde compound. The activated radical and the positive ion are formed using the ozone gas. Volatile gases may also be formed in accordance with the decomposition. Examples of the volatile gases may include carbon dioxide and water vapor. The $R_1$ and $R_2$ of the compound II include hydrogen, hydroxyl, alkyls, etc. The ketone and/or aldehyde are decomposed to form the compound III and the compound IV. The compound III and the compound IV correspond to water-soluble are carboxylic acid. Thus, the compound III and the compound IV may be removed by rinsing.

The acetic acid corresponds to a solvent that dissolves the photoresist. The pH of the acetic acid exists in the range of about 1.6 to about 5. Preferably, the pH of the acetic acid exists in the range of about 1.6 to about 2.4. The photoresist may be lifted off by the ozone under a strong acidic atmosphere. The photoresist is transformed to a carboxylic acid by the ozone so that oxidation-reduction potential is no less than about 1V while the pH is no more than about 5. The acetic acid also maintains under the acidic atmosphere. The concentration of the acetic acid may be about 95 to about 99.5%.

In order to form the stripping composition, a tubule is inserted into a container or a tank including acetic acid. Ozone gas is injected into the acetic acid through the tubule to bubble in the acetic acid. The ozone gas is formed using electrolysis. A composition having the acetic acid and the ozone gas bubble is ejected through another tubule. The composition is then sprayed onto a substrate having a photoresist pattern through a nozzle. The stripping composition wets the photoresist pattern to decompose the photoresist pattern. Hereinafter, the process of removing the photoresist pattern using the stripping composition is referred to as 'ozone wet lift'. The decomposed photoresist pattern is rinsed using ultra pure water. Therefore, the photoresist is completely removed from the substrate.

Photoresist residue is decomposed into soluble carbolylic acid, volatile carbon dioxide gas, water vapor, etc. using the stripping composition. The photoresist residue may be decomposed without toxic organic solvent. Hence, the process using the stripping composition may not pollute an environment. An $O_2$ ashing process may also be omitted, thereby simplifying the stripping process about the photoresist pattern although the $O_2$ ashing process may be performed before or after the conventional stripping process.

To form a conventional gate double layer, a first gate wiring layer and a second gate wiring layer are formed on a substrate. A photoresist pattern including novolak is formed on the substrate having the gate wiring layers formed thereon. The second gate wiring layer is etched using the photoresist pattern as an etching mask. The photoresist pattern is then removed using the stripping composition. After an $O_2$ ashing process is performed on the substrate, the first gate wiring layer is etched to form a gate pattern. However, the $O_2$ ashing process may advantageously be omitted during the ozone wet lift process of the present invention due to the strong oxidizing strength of the stripping composition.

When a double-layered gate pattern including Cr/Al layers is formed on a substrate, a Cr layer, an Al layer and a photoresist pattern are sequentially formed on the substrate. The Al layer is etched using the photoresist pattern as an etching mask. The photoresist pattern is removed using the stripping composition. When the Cr layer is etched to thereby form the Cr/Al double-layered gate pattern on the substrate.

After the gate pattern is formed on the substrate, a gate insulation layer is formed on the substrate having the gate pattern formed thereon. The gate insulation layer includes silicon nitride. A semiconductor layer and a doped amorphous silicon layer are formed on the gate insulation layer. The semiconductor layer includes amorphous silicon. The doped amorphous silicon layer and the semiconductor layer are etched so that a semiconductor layer pattern of an island shape and an ohmic contact layer pattern are formed on the gate insulation layer using a photolithography process. The doped amorphous silicon layer is etched using the photoresist pattern as an etching mask. After an $O_2$ ashing process is performed to remove polymers formed using a chlorine gas, and a stripping process is performed on the substrate including the photoresist pattern. The chlorine gas is used to etch the doped amorphous silicon layer. The stripping strips the photoresist pattern. However, the $O_2$ ashing process may be omitted in the ozone wet lift process of the present invention.

When a contact hole is formed, a gate contact and a data contact are simultaneously formed using an etching process, thereby damaging a photoresist pattern due to solidification thereof. In order to remove the solidified photoresist pattern, an $O_2$ ashing step is required before the stripping step according to a conventional stripping process. However, the solidified photoresist pattern may also be decomposed into a carboxylic acid by the ozone wet lift of the present invention. Therefore, the $O_2$ ashing process may be advantageously omitted.

When the stripping composition of the present invention is used to remove the residue of the photoresist pattern after the etching process, the residue of the photoresist pattern is easily removed without any adverse effects. The stripping composition is cheap and more effectively protects the environment in comparison with the conventional stripping material such as organic solvent, alkali solution, etc. In addition, the $O_2$ ashing process may be omitted to thereby simplify the stripping process although the $O_2$ ashing process is performed before or after a conventional stripping process.

Manufacturing Stripping Composition

A stripping composition for removing a photoresist including novolak included an acetic acid and an ozone gas. The ozone gas was included in the acetic acid as a bubble form.

In order to form the stripping composition, the acetic acid was inserted into a tank. A tubule was inserted into the tank including the acetic acid. A pH of the acetic acid was 2. The ozone gas was injected into the acetic acid through the tubule to bubble in the acetic acid. The ozone gas was formed using electrolysis. A composition having the acetic acid and the ozone gas bubble was ejected through another tubule.

Exemplary Embodiment

Figure 2:
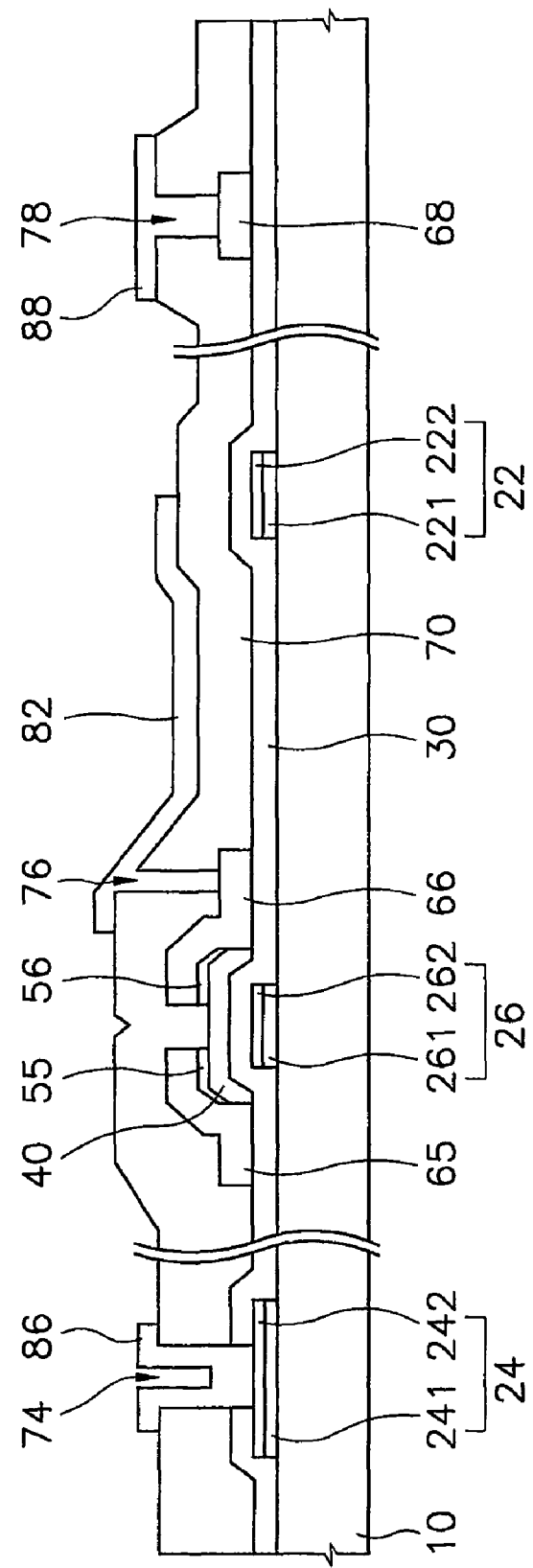
FIG. 2 is a cross-sectional view taken along line of II-II' in FIG. 1.

FIG. 1 is a schematic plan view showing the TFT substrate for an LCD apparatus according to one embodiment of the present invention, and FIG. 2 is a cross-sectional view taken line of II-II' in FIG. 1.

Referring to FIGS. 1 and 2, double-layered gate wirings are formed on an insulation substrate 10. The gate wirings include first gate wiring layers 221, 241 and 261, and second gate wiring layers 222, 242 and 262, respectively. The first gate wiring layers 221, 241 and 261 mainly include chromium (Cr), and the second gate wiring layers 222, 242 and 262 substantially include aluminum (Al).

The gate wiring includes a gate line 22, a gate pad 24 and a gate electrode 26 of a TFT. The gate line 22 extends in a first direction corresponding to a horizontal direction with respect to the insulation substrate 10. The gate pad 24 is connected to the end portion of the gate line 22 in order to transmit a gate signal from outside to the gate line 22. The gate electrode 26 is connected to the gate line 22.

A gate insulating layer 30 formed on the substrate 10 is formed over the gate wirings 22, 24 and 26. The gate insulating layer 30 includes silicon nitride.

A semiconductor layer 40 is formed on the gate insulating layer 30 of the gate electrode 26. The semiconductor layer 40 has semiconductor material such as amorphous silicon. Ohmic contact layers 54 and 56 are formed on the semiconductor layer 40. The ohmic contact layers 54 and 56 have a silicide or N+ hydrogenated amorphous silicon doped with N type dopants by a high concentration.

Data wiring layers 62, 65, 66 and 68 are formed on the ohmic contact layers 54 and 56 and the gate insulating layer 30. The data wiring layers 62, 65, 66 and 68 have a molybdenum layer or a molybdenum-tungsten alloy layer. The data wiring layers 62, 65, 66 and 68 extend in a longitudinal direction with respect to the substrate 10. The data wiring layers 62, 65, 66 and 68 include a data line 62, a source electrode 65, a data pad 68 and a drain electrode 66.

The data line 62 intersects the gate line 22, and the data line 62 defines a pixel. The source electrode 65 is divided from the data line 62, and the source electrode 65 extends to an upper portion of the ohmic contact layer 54. The data pad 68 is connected to an end portion of the data line 62, and the data pad 68 receives a pixel signal from outside. The drain electrode 66 is separated from the source electrode 65 and the drain electrode 66 is disposed on the ohmic contact layer 56. The drain electrode is opposite to the source electrode 65 by interposing the gate electrode 26 therebetween.

A protecting layer including a passivation layer 70 is formed on the data wirings 62, 65, 66 and 68. The protecting layer may include an organic layer.

Contact holes 76 and 78 are formed through which the drain electrode 66 and the data pad 68 are exposed, respectively. Another contact hole 74 is formed through which the gate pad 24 and the gate insulating layer 30 are exposed. The contact holes 76 and 78 are formed in a polygonal shape or a circular shape, through which the drain electrode 66 and the data pad 68 are exposed. Dimension of each of the contact holes is no more than about 2 mm×60 μm. Preferably, the dimension is no less than about 0.5 mm×15 μm.

A pixel electrode 82 is formed on the passivation layer 70 in a pixel. The pixel electrode 82 is electrically connected to the drain electrode 66 through the contact hole 76. Also, an auxiliary gate pad 86 and an auxiliary data pad 88 are formed on the passivation layer 70. An auxiliary gate pad 86 and an auxiliary data pad 88 are connected to the gate pad 24 and the data pad 68 through the contact holes 74 and 78, respectively. The pixel electrode 82, the auxiliary gate pad 86 and the auxiliary data pad 88 have ITO.

Referring to FIG. 1 and FIG. 2, a storage capacitor includes the pixel electrode 82 and the gate line 22. When storage capacitance of the storage capacitor is insufficient, an additional wiring for the storage capacitor may be formed on a layer identical to the gate wirings 22, 24 and 26.

Also, the pixel electrode 82 is overlapped with the data line 62 to maximize an aperture ratio. Although the pixel electrode 82 is overlapped on the data line 62, parasite storage capacitance is low because of a low dielectric constant of the passivation layer.

Hereinafter, referring to FIGS. 1 to 7, a method of manufacturing the TFT substrate for the LCD apparatus according to an exemplary embodiment of the present invention will be disclosed.

Figure 3:
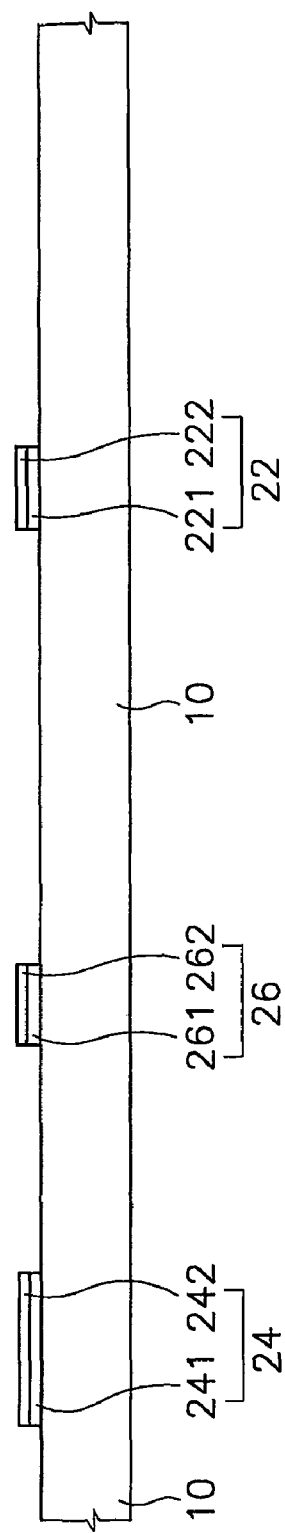
FIGS. 3 to 6 are cross-sectional views illustrating a method of manufacturing a TFT substrate according to one embodiment of the present invention.

Referring to FIG. 3, a chromium layer for first gate wiring layers 221, 241 and 261 is formed on the insulation substrate 10. The chromium layer generally has good physical and chemical characteristics. An aluminum layer having a low specific resistance is then formed for forming second gate wiring layers 222, 242 and 262.

A photoresist film including novolak is formed on the second gate wiring layers 222, 242 and 262. The photoresist film is exposed using a photo mask. The exposed photoresist film is then developed and dried to form a photoresist pattern. The aluminum layer is etched using the photoresist pattern as an etching mask to form the second gate wiring layers 222, 242 and 262. The photoresist pattern is removed using a stripping composition. Here, the stripping composition includes an acetic acid and an ozone gas contained in the acetic acid as a bubble form. Preferably, a concentration of the ozone gas included in the acetic acid is about 80,000 to about 90,000 ppm. The chromium layer is etched to form the first gate wiring layers 221, 241 and 261. In this embodiment, an $O_2$ ashing process may be omitted. As a result, the gate wirings including the gate line 22, the gate electrode 26 and the gate pad 24 are formed on the insulation substrate 10. The gate wirings extend in a horizontal direction relative to the insulation substrate 10.

When a stripping composition includes ozone and ultra pure water, there is a problem that the aluminum layers may be dissolved by the stripping composition because of the high oxidation-reduction potential (ORP) of the aluminum. Although $NH_4OH$ may be advantageously added to overcome this problem, the aluminum layers are not dissolved by the stripping composition of the present invention since the stripping composition of the invention includes the ozone and the acetic acid.

The stripping rate of the stripping composition containing the ozone and the ultra pure water is about 0.1 μm/min, whereas the stripping rate of the stripping composition of the invention is about 6 μm/min. That is, the stripping rate of the stripping composition of the invention is greatly superior to that of the stripping composition including the ozone and the ultra pure water.

Additionally, since the $O_2$ ashing process can be omitted before etching the chromium layers using the stripping composition of the invention, a time for end point detection (EPD) can be reduced to about 30 seconds. However, when the conventional stripping composition such as SC2002 or SC2001 is employed for etching the chromium layers, the EDP is augmented to about 40 to about 60 seconds in comparison with the EPD obtained by employing the stripping composition of the invention. Here, the SC2002 and the SC2001 are produced by Dongjin Semichem Ltd. in Korea, in which the SC2002 includes by about 9 weight percent of N-ethyl methyleamine, by about 39 weight percent of N-methyle pyrrolidone, by about 49 weight percent of Butyl diglycol, and by about 3 weight percent of gallic acid while the SC2001 includes by about 10 weight percent of N-ethyl methylamine, by about 40 weight percent of N-methylpyrrolidone, and by about 50 weight percent of Butyl diglycol.

Figure 4:
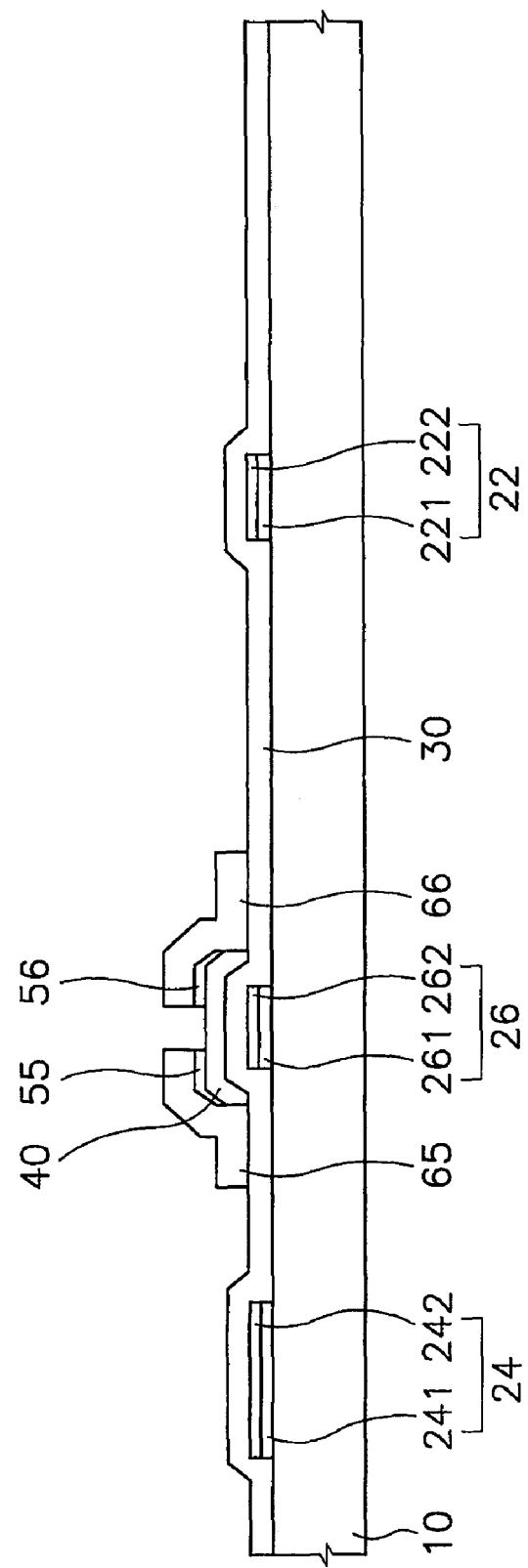

Referring to FIG. 4, a gate insulation layer 30, a semiconductor layer and a doped amorphous silicon layer are successively formed. The gate insulation layer 30 includes silicon nitride and the semiconductor layer has amorphous silicon. A photoresist pattern including novolak is formed on the doped amorphous silicon layer. The doped amorphous silicon layer is etched using the photoresist pattern as an etching mask to form a doped amorphous silicon layer pattern.

After etching the doped amorphous silicon layer, the photoresist pattern is removed using a stripping composition including an acetic acid and a bubble formed ozone gas contained in the acetic acid without an $O_2$ ashing process. Then, the semiconductor layer is etched to form a semiconductor layer pattern 40 of an island shape and ohmic contact layers 55 and 56 on the gate insulation layer 30 positioned on the gate electrode 26.

Figure 5:
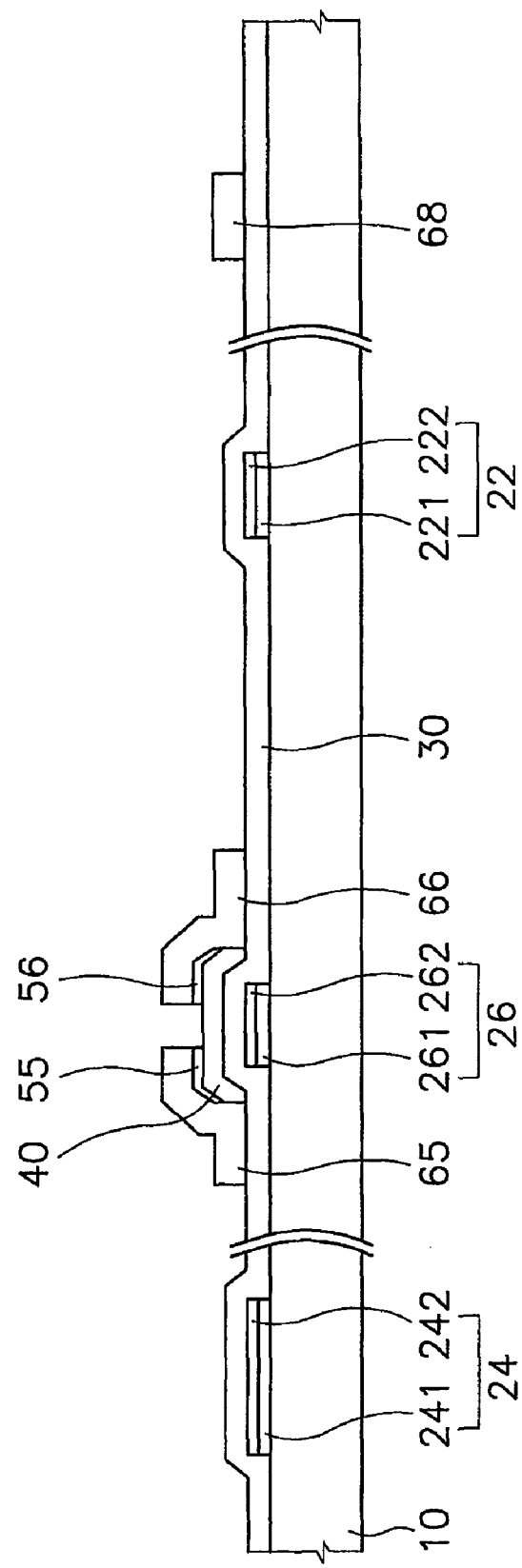

Referring to FIG. 5, molybdenum or molybdenum-tungsten alloy is then deposited to stack data wiring layers 65, 66 and 68. The data wiring layers 65, 66 and 68 are then etched to form a data wiring including a data line 62, a source electrode 65, a data pad 68 and a drain electrode 66. The data line 62 intersects the gate line 22. The source electrode 65 is connected to the data line 62, and the source electrode 65 extends to an upper portion of the gate electrode 26. The data pad 68 is connected to one end portion of the data line 62. The drain electrode 66 is separated from the source electrode 65, and the drain electrode 66 is opposite to the source electrode 65 by interposing the gate electrode 26 therebetween.

The data wiring may include a single-layered structure or a double-layered structure. That is, the data wiring includes a molybdenum layer, a molybdenum-tungsten alloy layer or a molybdenum and molybdenum alloy layer. Here, the molybdenum-tungsten alloy layer preferably includes tungsten by a concentration of about 10 weight percent.

Figure 6:
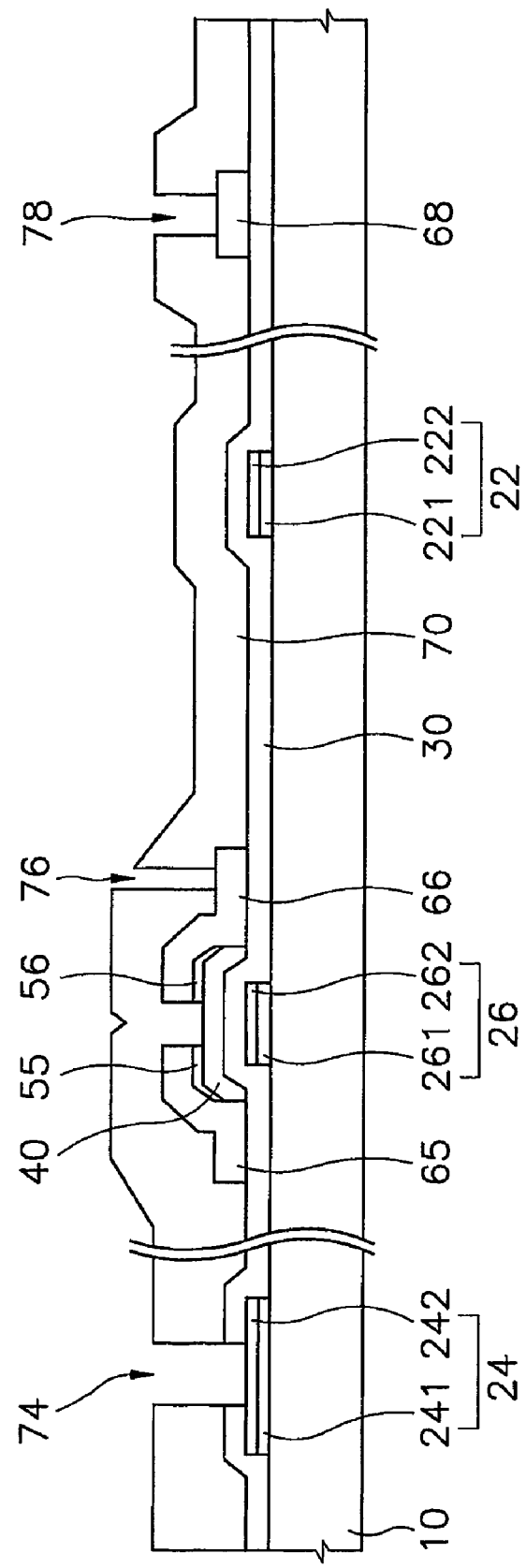

A portion of an amorphous silicon pattern that is not masked by the data wirings 62, 65, 66 and 68 is then etched so that the amorphous silicon pattern is divided into two regions so that the semiconductor layer pattern 40 is exposed. The amorphous silicon pattern is doped with impurities. The semiconductor layer pattern 40 is disposed between the divided amorphous silicon layers 55 and 56. Preferably, a surface of the exposed semiconductor layer 40 is then stabilized by oxygen plasma. Referring to FIG. 6, a passivation layer is then formed.

A photoresist pattern including novolak is formed on the passivation layer 70. The gate insulation layer 30 and the passivation layer 70 are etched using the photoresist pattern as an etching mask. The photoresist pattern is then removed using a stripping composition to form contact holes 74, 76 and 78 without an $O_2$ ashing process. The stripping composition includes an acetic acid and an ozone gas included in the acetic acid as a bubble form. Preferably, a concentration of the ozone gas included in the acetic acid is about 80,000 to about 90,000 ppm. The gate pad 24, the drain electrode 66 and the data pad 68 are exposed through the contact holes 74, 76 and 78, respectively. The contact holes 74, 76 and 78 may have circular shapes or polygonal shapes. The dimensions of the contact holes 74 and 78 are below about 2 mm×60 μm. The pads 24 and 68 are exposed through the contact holes 74 and 78. Preferably, the dimensions of the contact holes 74 and 78 are above about 0.5 mm×15 μm.

Referring to FIGS. 1 to 2, ITO layer is then deposited. The deposited ITO layer is then etched. Therefore, an auxiliary gate pad 86, an auxiliary data pad 88 and a pixel electrode 82 are formed by means of a photolithography process. The pixel electrode 82, the auxiliary gate pad 86 and the auxiliary data pad 88 are connected to the drain electrode 66, the gate pad 24 and the data pad 68 through a first contact hole 76, a second contact hole 74 and a third contact hole 78. Preferably, nitrogen gas is used in a pre-heating process. The pre-heating may be performed before depositing the ITO. The nitrogen gas prevents formation of a metal oxide layer that may be formed on an upper portion of metal layers 24, 66 and 68 that are exposed through the contact holes 74, 76 and 78.

Hereinafter, referring to FIGS. 7 to 9, a pixel of the TFT substrate for the LCD apparatus according to an exemplary embodiment of the present invention using 4 masks will be disclosed.

Figure 7:
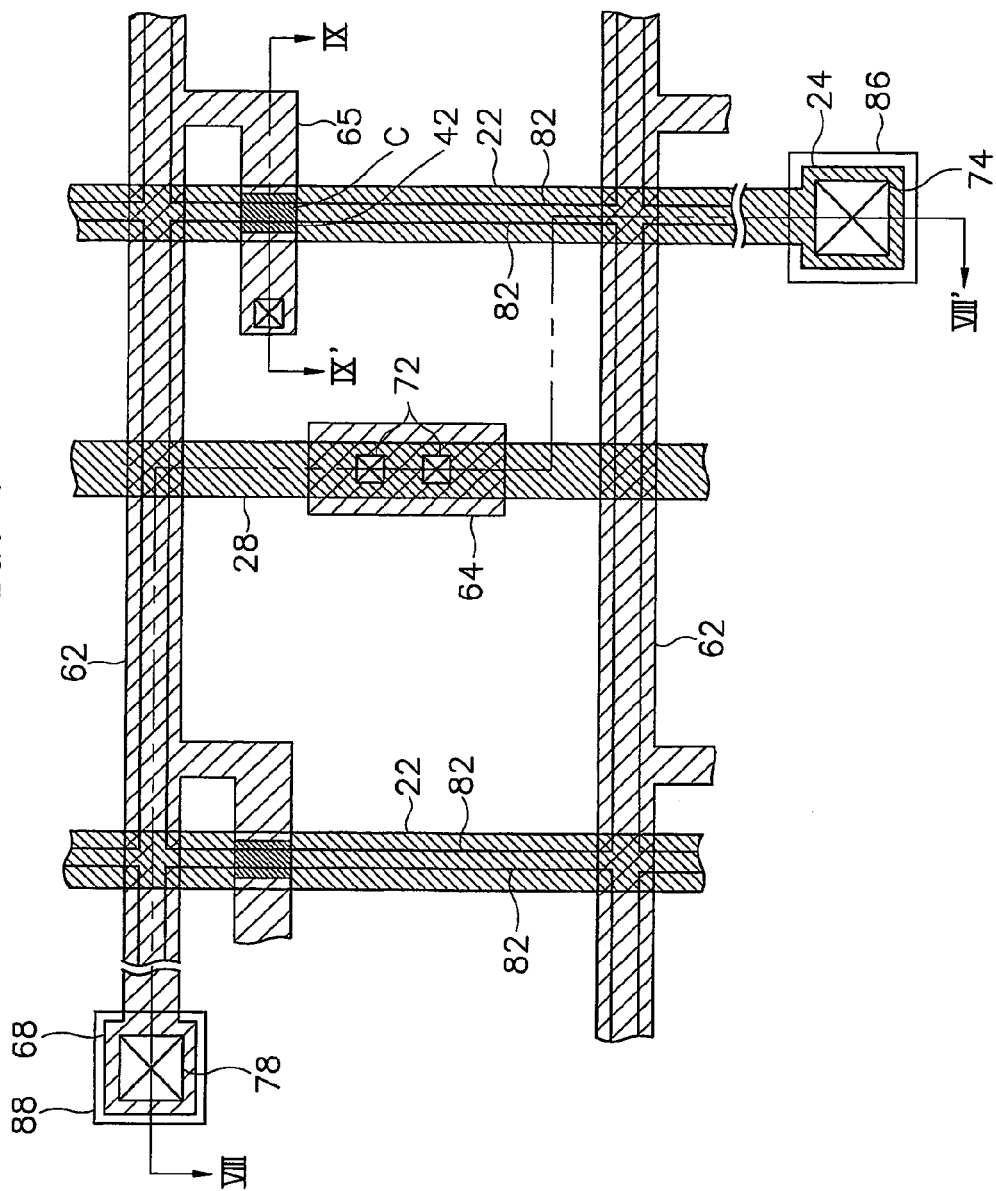
FIG. 7 is a plan view illustrating a TFT substrate for an LCD apparatus according to another embodiment of the present invention.
Figure 8:
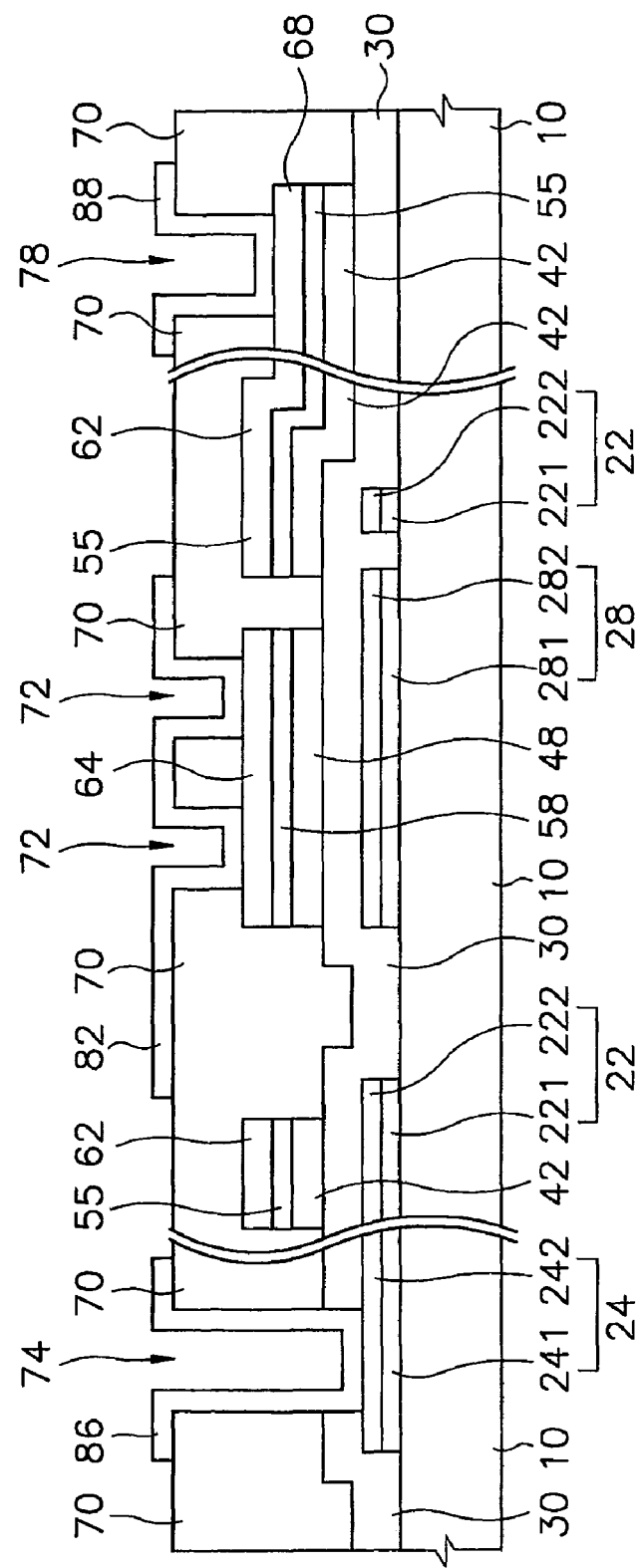
FIGS. 8 and 9 are cross-sectional views taken along line of VIII-VIII' and IX-IX' in FIG. 7, respectively.
Figure 9:
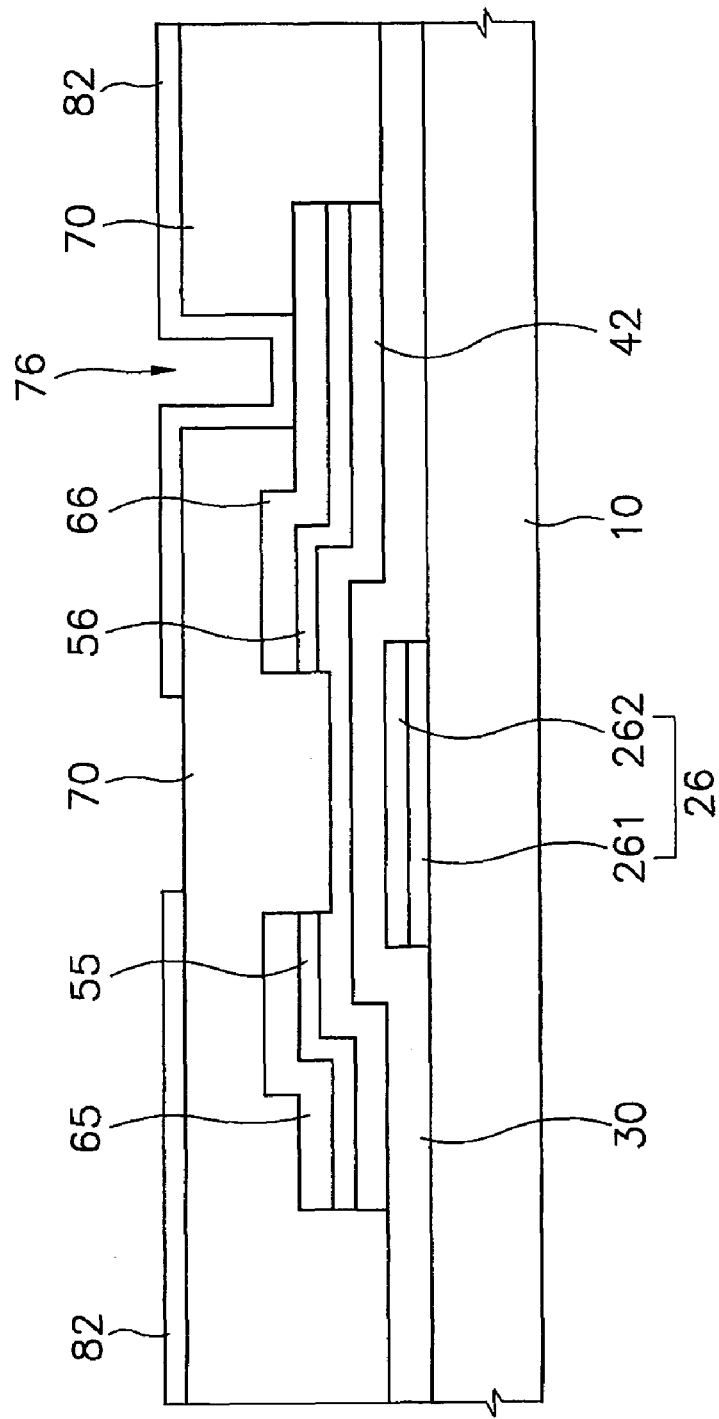

FIG. 7 is a plan view showing a TFT substrate for an LCD apparatus according to another exemplary embodiment of the present invention, and FIGS. 8 and 9 are cross-sectional views taken along lines VIII-VIII' line and IX-IX' shown in FIG. 7, respectively.

Referring to FIGS. 7 to 9, gate wirings are formed on an insulation substrate 10. The gate wirings have double-layered constructions, and the gate wirings include first gate wiring layers 221, 241 and 261 and second gate wiring layers 222, 242 and 262, respectively. The first gate wiring layers 221, 241 and 261 include chromium, whereas the second gate wiring layers 222, 242 and 262 include aluminum.

Each of the gate wirings includes a gate line 22, a gate pad 24 and a gate electrode 26 of a TFT. The gate line 22 extends in a horizontal direction with respect to the insulation substrate 10, and the gate pad 24 is connected to the end portion of the gate line 22 in order to transmit a gate signal from outside to the gate line 22. The gate electrode 26 is connected to the gate line 22.

A storage capacitor line 28 is formed on the substrate 10. The storage capacitor line 28 is disposed in parallel with respect to the gate line 22. The storage capacitor line 28 has a double-layered structure. A storage capacitor includes the storage capacitor line 28 and a conductive pattern 68 for the storage capacitor. The storage capacitor line 28 is overlapped with the conductive pattern 68 of the storage capacitor. The storage capacitor may increase the storage capacity of a pixel. When the storage capacitance may be sufficient according as the pixel electrode 22 is overlapped with the gate line 82, the storage capacitance line 28 may be omitted. A voltage applied to the storage capacitance line 28 may be substantially identical to a voltage applied to a common electrode.

A gate insulating layer 30 is formed on the gate wirings 22, 24 and 26 and the storage line 28. The gate insulating layer 30 is formed over the gate wirings 22, 24, 26 and 28. The gate insulating layer 30 may have silicon nitride SiNx.

Semiconductor patterns 42 and 48 are formed on the gate insulating layer 30. The semiconductor patterns 42 and 48 have semiconductor material such as hydrogenated amorphous silicon. Ohmic contact layer patterns or intermediate layer patterns 55, 56 and 58 are formed on the semiconductor patterns 42 and 48. The ohmic contact layer patterns and the intermediate layer patterns may have amorphous silicon. The amorphous silicon is doped with N type dopants such as P (phosphorus) by a high concentration.

Data wiring layers 62, 64, 65, 66 and 68 are formed on the ohmic contact layer patterns 55, 56 and 58. The data wiring layers 62, 64, 65, 66 and 68 have molybdenum or molybdenum alloy. Data wirings include a data line assembly 62, 68 and 65 and a conductive pattern 64 for a storage capacitor. The data line assembly 62, 68 and 65 have a data line 62, a data pad 68 and a source electrode 65 of a TFT. The data line 62 extends in a longitudinal direction with respect to the substrate. The data pad 68 is connected to one end portion of the data line 62 and receives an exterior image signal. The source electrode 65 of the TFT is divided from the data line 62. The conductive pattern 64 for the storage capacitor is separated from the data line assembly 62, 68 and 65, and the conductive pattern 64 is formed on a drain electrode 66 of the TFT and the storage line 28. The drain electrode 66 is separated from the source electrode 65, and the drain electrode 66 is opposite to the source electrode 65 by interposing the gate electrode 26 therebetween. When the storage line 28 is omitted, the conductive pattern 64 for the storage capacitor is also omitted.

The ohmic contact layer patterns 55, 56 and 58 decrease a contact resistance between the semiconductor patterns 42 and 48 and the data wirings 62, 64, 65, 66 and 68. The ohmic contact layer patterns 55, 56 and 58 have shapes substantially identical to the data wirings 62, 64, 65, 66 and 68. The semiconductor patterns 42 and 48 are formed under the ohmic contact layer patterns 55, 56 and 58. The data wirings 62, 64, 65, 66 and 68 are formed on the ohmic contact layer patterns 55, 56 and 58. A middle layer pattern of the data line assembly has a shape substantially identical to the data line assembly 62, 65 and 68, and a middle layer pattern of the drain electrode has a shape substantially identical to the drain electrode 66. A middle layer pattern of the storage capacitor has a shape substantially identical to the conductive pattern of the storage capacitor.

The semiconductor pattern 42 and 48 have shapes substantially identical to the data wirings 62, 64, 65, 66 and 68 and the ohmic contact patterns 55, 56 and 68 except a channel region of the TFT. Particularly, the semiconductor pattern of the storage capacitor has a shape substantially identical to the conductive pattern of the storage capacitor, and the conductive pattern of the storage capacitor has a shape substantially identical to the contact layer pattern of the storage capacitor. However, the semiconductor pattern of the TFT is different from the data wirings or the contact layer pattern. That is, the source electrode 65 of the data line assembly and the drain electrode 66 of the data line assembly are separated from each other in the channel region of the TFT. Also, the intermediate layer 55 of the data line assembly and the contact layer pattern 56 for the drain electrode are separated from each other. However, the semiconductor pattern 42 for the TFT is connected to form the channel of the TFT. A passivation layer 70 is formed on the data wirings 62, 64, 65, 66 and 68.

The passivation layer 70 has contact holes 76, 78 and 72 and another contact hole 74. The drain electrode 66, the data pad 64 and the conductive pattern 68 for the storage capacitor are exposed through the contact holes 76, 78 and 72. The gate pad 24 and the gate insulating layer 30 are exposed through another contact hole 74.

A pixel electrode 82 is formed on the passivation layer. The pixel electrode 82 receives an image signal from the TFT to form electric field with a common electrode. The pixel electrode 82 has transparent conductive material such as ITO. The pixel electrode 82 is electrically connected to the drain electrode 66 through the contact hole 76 to receive the image signal. The pixel electrode 82 is overlapped with the gate line 22 and the data line 62 to increase aperture ratio. The gate line 22 and the data line 62 are adjacent to the pixel electrode 82. The pixel electrode 82 may not be overlapped with the gate line 22 or the data line 62. The pixel electrode 82 is connected to the conductive pattern for the storage capacitor through the contact hole 72 to transmit the image signal to the conductive pattern 64. An auxiliary gate pad 86 and an auxiliary data pad 88 are connected to the gate pad 24 and the data pad 68 through the contact holes 74 and 78, respectively. The auxiliary gate pad 86 and the auxiliary data pad 88 increase a cohesive strength between the pads 24 and 68 and external circuit apparatus. The auxiliary gate pad 86 and the auxiliary data pad 88 also protect the pads 24 and 68, respectively. However, the auxiliary gate pad 86 and the auxiliary data pad 88 may be omitted.

Hereinafter, referring to FIGS. 8 to 17B, a method of manufacturing the TFT substrate for the LCD apparatus according to an exemplary embodiment of the present invention using 4 masks will be disclosed.

Figure 10A:
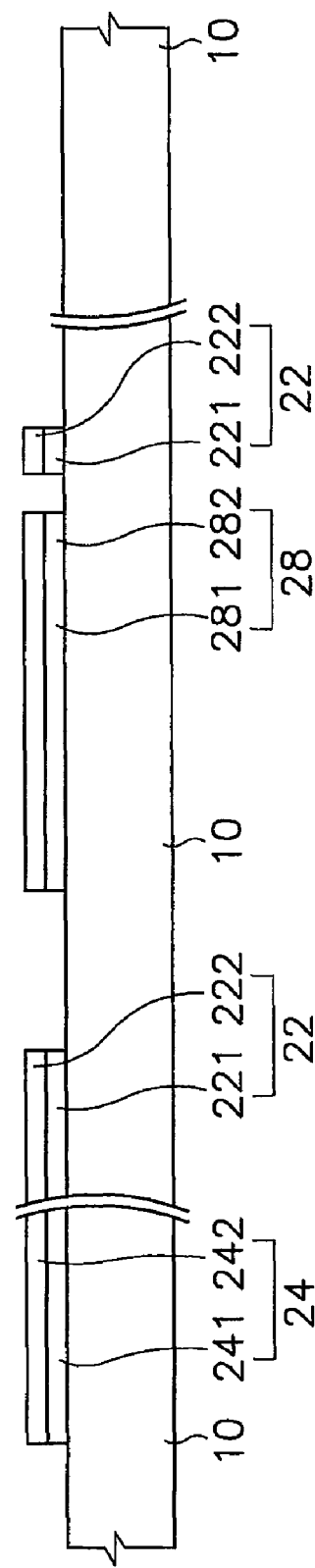
FIGS. 10A to 17B are cross-sectional views illustrating a method of manufacturing the TFT substrate in FIGS. 8 and 9, respectively.
Figure 10B:
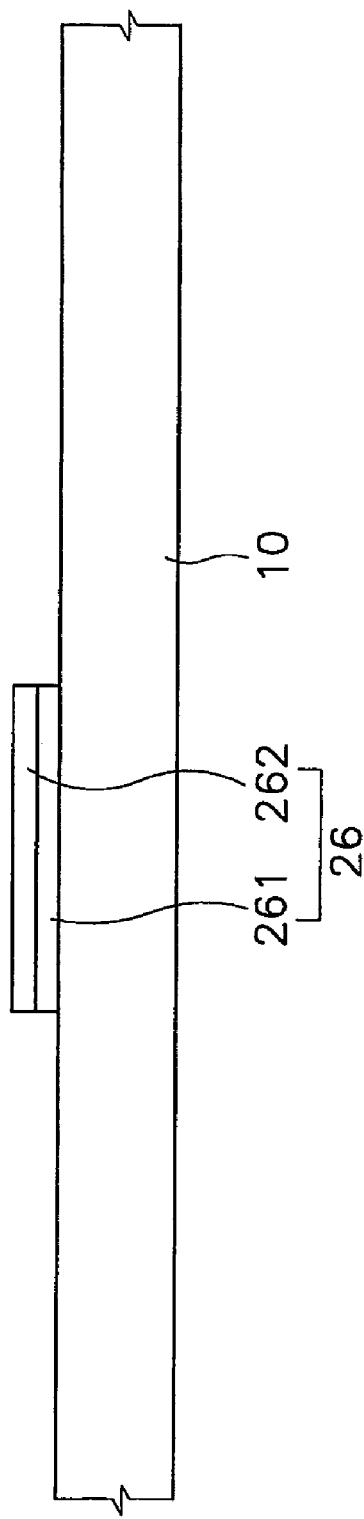

Referring to FIGS. 10A and 10B, first gate wiring layers 221, 241, 261 and 281 are formed on an insulation substrate 10. The first gate wiring layers 221, 241, 261 and 281 include chromium having good physical and chemical characteristics. Second gate wiring layers 222, 242, 262 and 282 are formed on the first gate wiring layers 221, 241, 261 and 281, respectively. The second gate wiring layers 222, 242, 262 and 282 include aluminum having a low specific resistance.

After a photoresist pattern (not shown) including novolak is formed on the second gate wiring layers 222, 242, 262 and 282, the second gate wiring layers 222, 242, 262 and 282 are etched using the photoresist pattern as an etching mask. After etching the second gate wiring layers 222, 242, 262 and 282, the photoresist pattern is removed using a stripping composition that includes an acetic acid and a bubble shaped ozone gas contained in the acetic acid. Then, the first gate wiring layers 221, 241, 261 and 281 are etched to form gate wirings and a storage capacitor line 28. Here, the gate wirings include a gate line 22, gate pad 24 and a gate electrode 26.

Figure 11A:
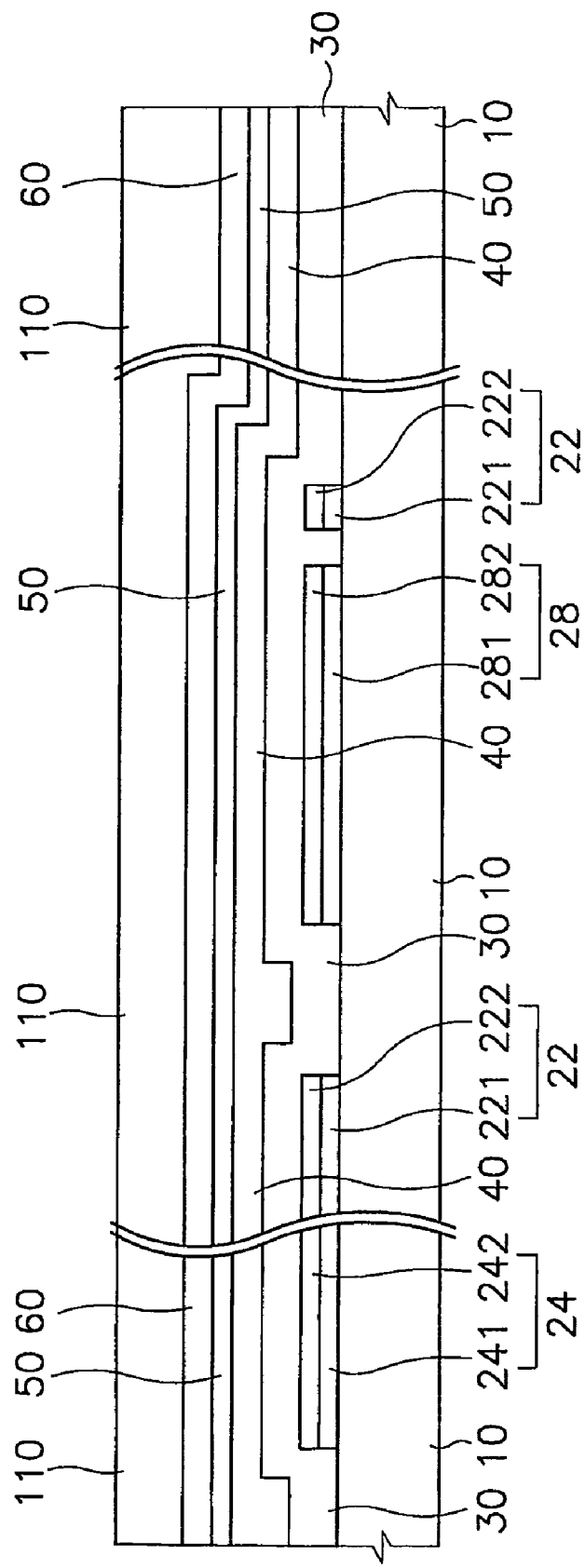
Figure 11B:
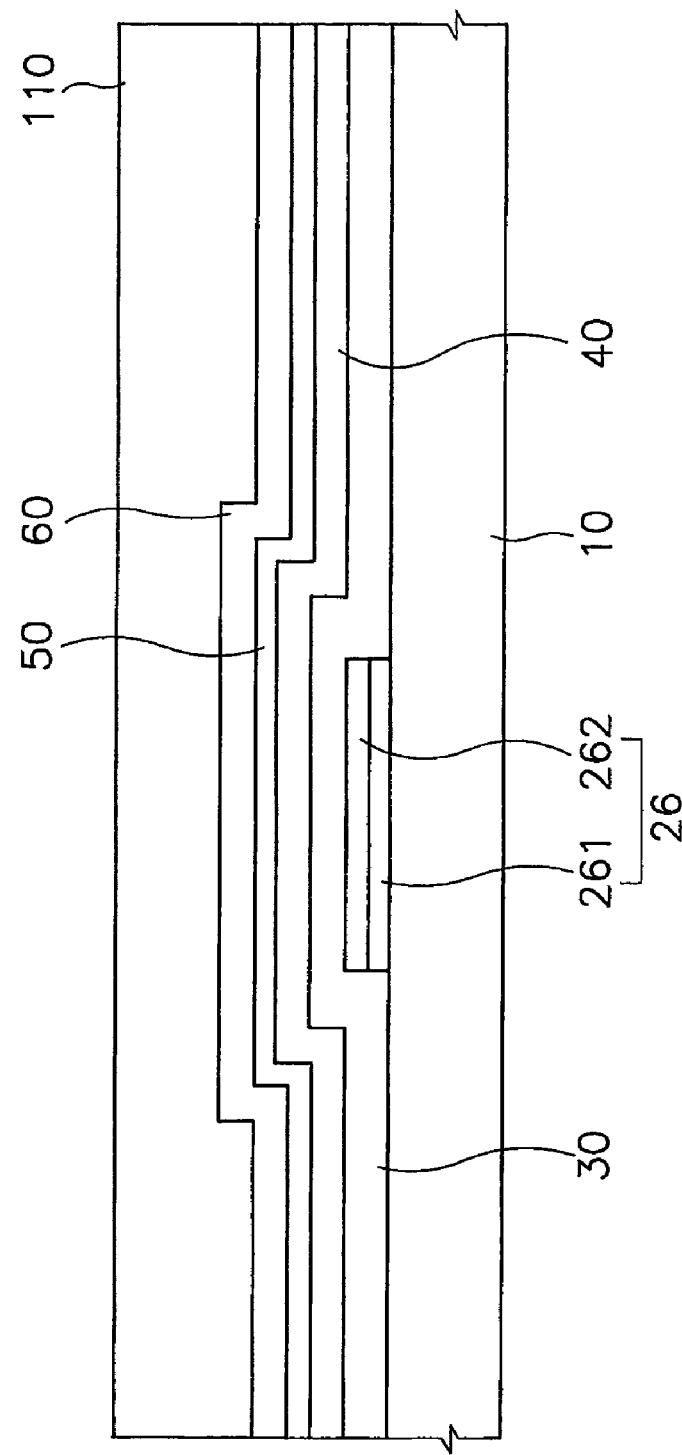

Referring to FIGS. 11A and 11B, a gate insulating layer 30 is then formed. A semiconductor layer 40 is formed on the gate insulating layer 30. An intermediate layer 50 is formed on the semiconductor layer 40. The gate insulating layer 30, the semiconductor layer 40 and the intermediate layer 50 are formed by a chemical vapor deposition. A thickness of the gate insulating layer 30 is from about 1,500 Å to about 5,000 Å, a thickness of the semiconductor layer 40 is from about 500 Å to about 2,000 Å, and a thickness of the intermediate layer 50 is from about 300 Å to about 600 Å.

The gate insulating layer 30, the semiconductor layer 40 and the intermediate layer 50 include silicon nitride. MoW is deposited on the intermediate layer 50 by sputtering to form a conductive layer 60. A photoresist film 110 is then formed on the conductive layer 60. The thickness of the photoresist film 110 is from about 1 μm to about 2 μm.

Figure 12A:
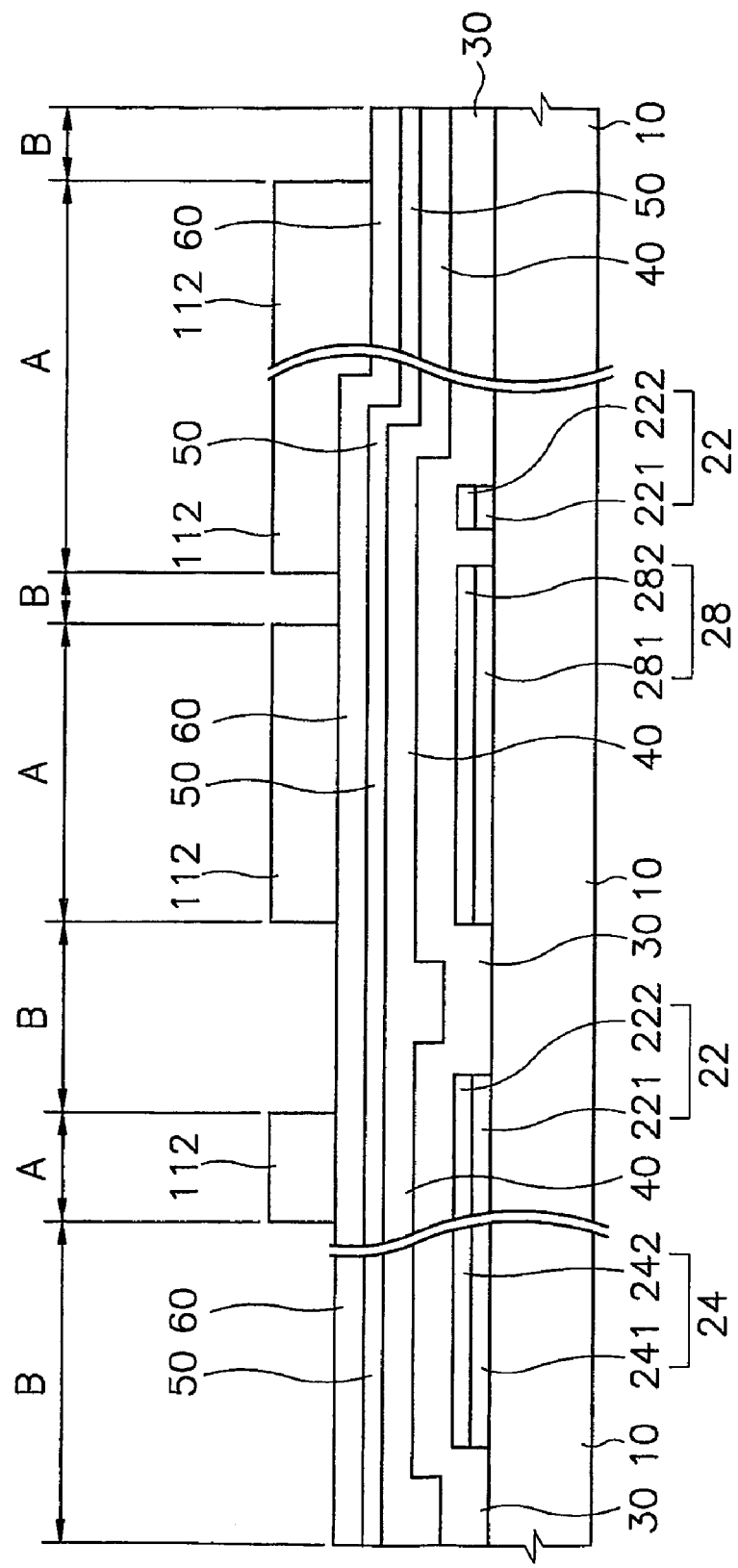
Figure 12B:
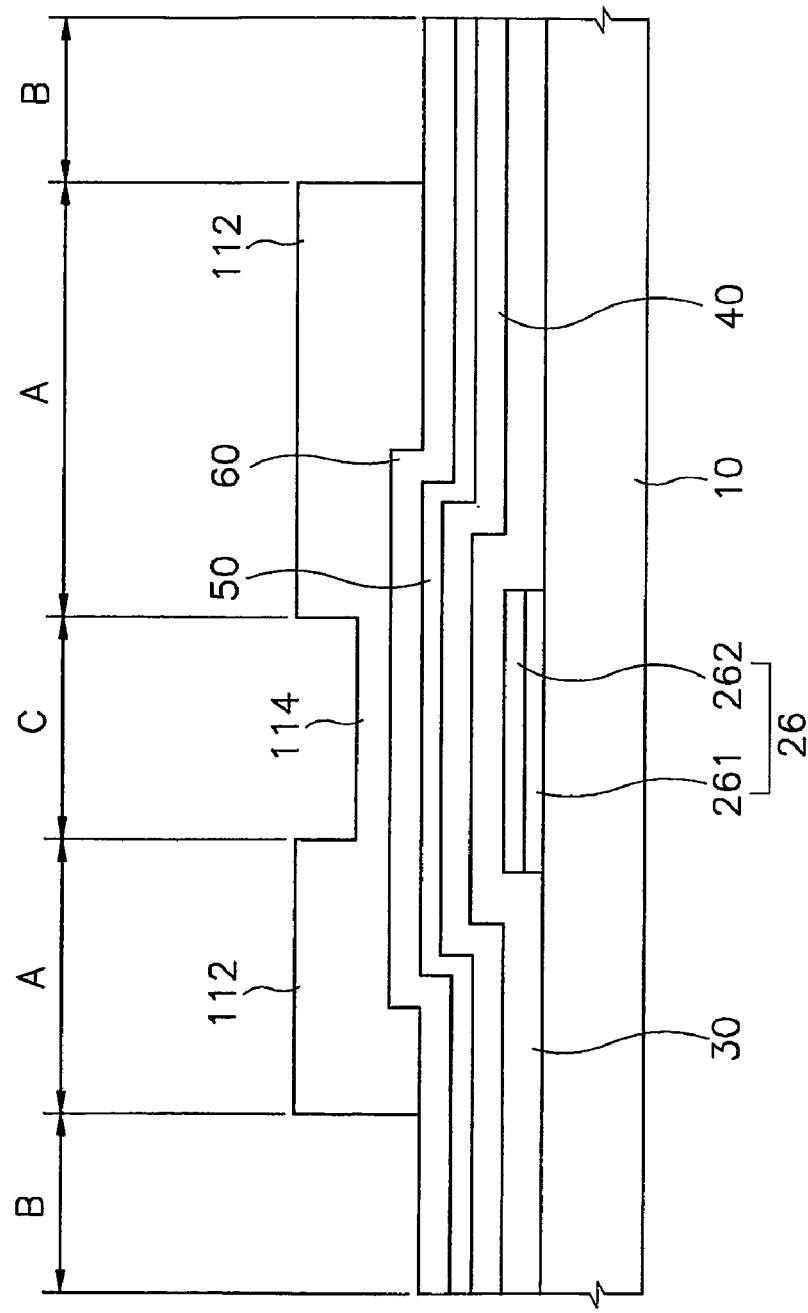

Referring to FIGS. 12A and 12B, photoresist film patterns 112 and 114 are then formed by means of an exposure process and a developing process. The exposure process is performed using a mask. A thickness of a first region 114 of the photoresist film patterns 112 and 114 are thinner than a thickness of a second region 112 of the photoresist film patterns 112 and 114. The first region 114 is disposed on a channel region 'C' of a TFT. The channel region of the TFT is disposed between the source electrode 65 and the drain electrode 66. The second region is disposed on a data wiring assembly 'A' on which data wirings 62, 64, 65, 66 and 68 will be formed. A photoresist film disposed on the remaining region 'B' is removed. The remaining region 'B' is different from the first region 114 and the second region 112. A ratio of the remaining thickness of the photoresist film of the first region 114 to the second region 112 varies corresponding to a condition of an etching process. Preferably, the ratio of the first region 114 to the second region 112 is no more than about a half. The remaining thickness of the photoresist film of the first region 114 may be no more than about 4,000 Å.

The thickness of the photoresist film may be determined by means of a control of a light intensity of the first region 114. The light intensity may be controlled by means of a pattern having a slit, a pattern having a lattice shape or a translucent film.

Preferably, an interval between lines of the pattern, or an interval between the patterns that is an interval between the slits is smaller than a resolution of exposure apparatus. When a translucent film is used, transmittance of a mask may be determined by a transmittance and a thickness of the translucent film.

When the photoresist film is exposed through the mask, polymers at a portion of the photoresist film directly exposed by the light are fully decomposed, polymers at a portion of the photoresist film on which the translucent film is disposed are partially decomposed, and polymers at a masked portion of the photoresist film are not decomposed.

When the photoresist film is developed, a portion in which high polymers are not decomposed remains. Therefore, a thickness of photoresist film in partially exposed portion is thinner than a thickness of photoresist film in unexposed portion. When exposing time is too long, all the high polymers are decomposed. Therefore, the exposing time needs to be controlled so that all the high polymers are not decomposed.

A reflowable material may be used to form a thin photoresist film 114. The thin photoresist film 114 may be formed by means of an exposure process, developing process and reflowing process, thereby reflowing an unexposed portion of the photoresist film into an exposed portion of the photoresist film. The exposure process is performed using a conventional mask. The mask has a region through which a light passes, and another region through which a light does not pass.

The photoresist film pattern 114 and the layers disposed under the photoresist film pattern 114 are then etched. The layers disposed under the photoresist film pattern 114 have the conductive layer 60, an intermediate layer 50 and the semiconductor layer 40. The data wirings and the layers disposed under the data wirings remain in the data wiring region 'A'. The semiconductor layer remains in the channel region 'C'. A conductive layer, an intermediate layer and a semiconductor layer in the remaining region 'B' are removed so that the gate insulating layer 30 is exposed. The remaining region 'B' is different from the data wiring region 'A' or the channel region 'C'.

Figure 13A:
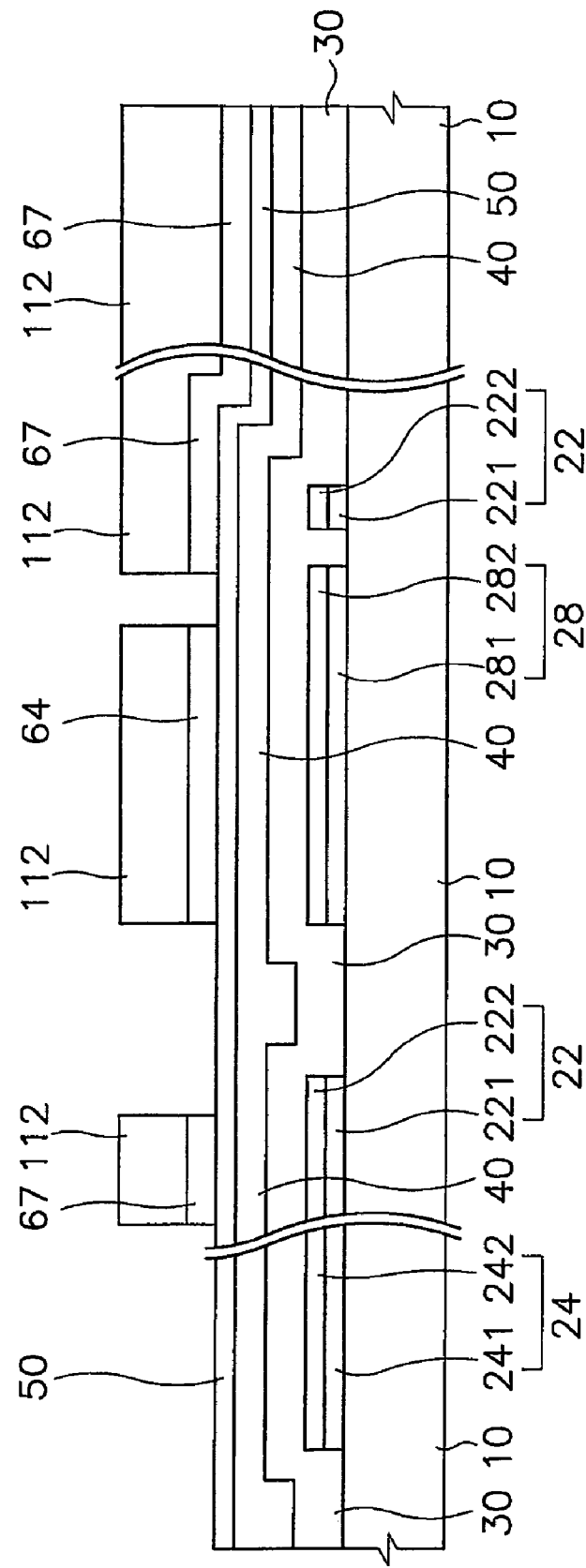
Figure 13B:
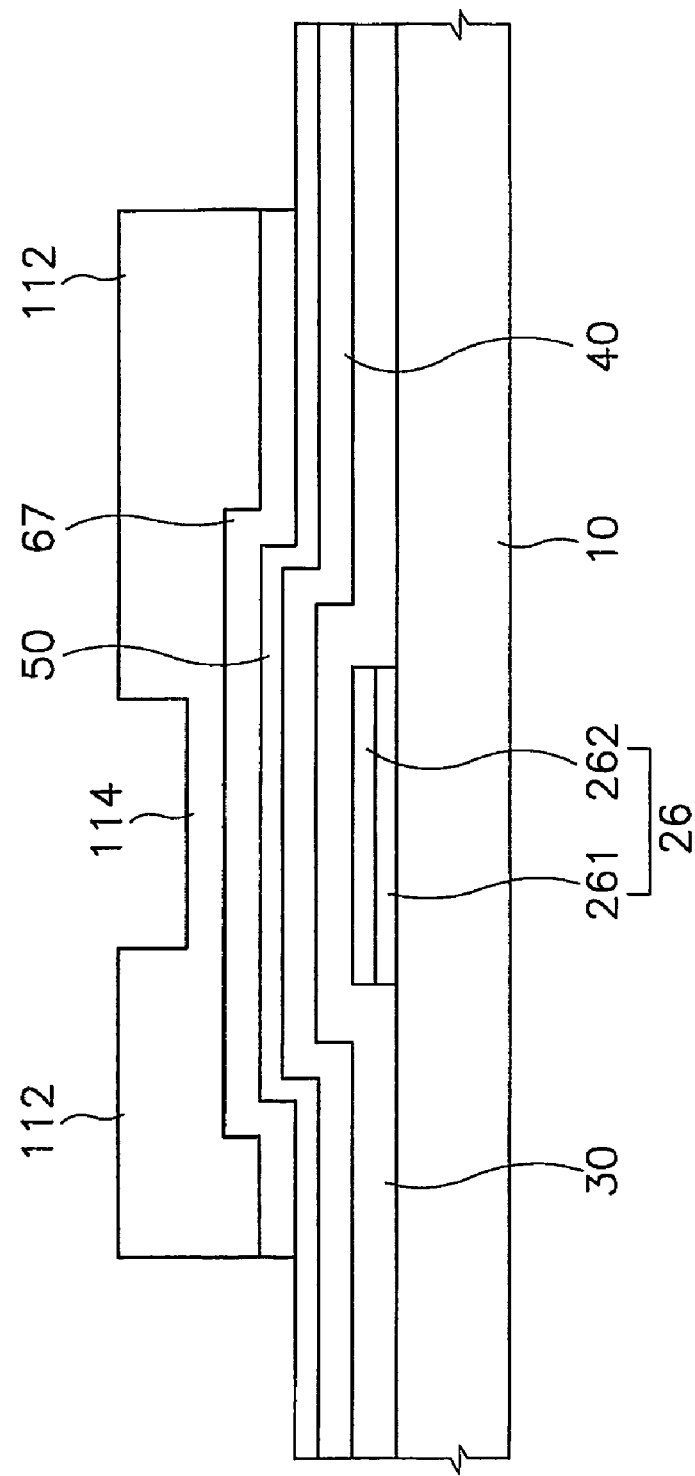

Referring to FIGS. 13A and 13B, the exposed conductive layer 60 of the remaining region 'A' is then removed to expose the intermediate layer 50. The exposed conductive layer 60 is disposed on the intermediate layer 50. A dry etching or a wet etching may be used. Preferably, the conductive layer 60 is etched under a condition that the photoresist film patterns 112 and 114 are substantially not etched. However, in dry etching, the conductive layer 60 may not be etched without etching the photoresist film patterns 112 and 114 so that the conductive layer 60 is etched with the photoresist film patterns 112 and 114. A thickness of a first region 114 in dry etching is thicker than a thickness of a first region 114 in wet etching so that the conductive layer 60 is not exposed by means of etching the first region in dry etching.

The conductive layer of the channel region 'C' and the conductive layer of the data wiring region 'A' remain, but the conductive layer 60 in the remaining region 'B' is removed, thereby exposing the intermediate layer 50. The conductive layers of the channel region 'C' and the data wiring region 'A' include the conductive pattern 67 for source/drain, and the conductive pattern 68 for the storage capacitor. The remaining conductive patterns 67 and 64 have shapes substantially identical to the data wirings 62, 64, 65, 66 and 68 except the source electrode 65 and the drain electrode 66. The source electrode 65 and the drain electrode 66 are connected in the remaining conductive patterns. When the dry etching is performed, the photoresist film patterns 112 and 114 are also etched.

Figure 14A:
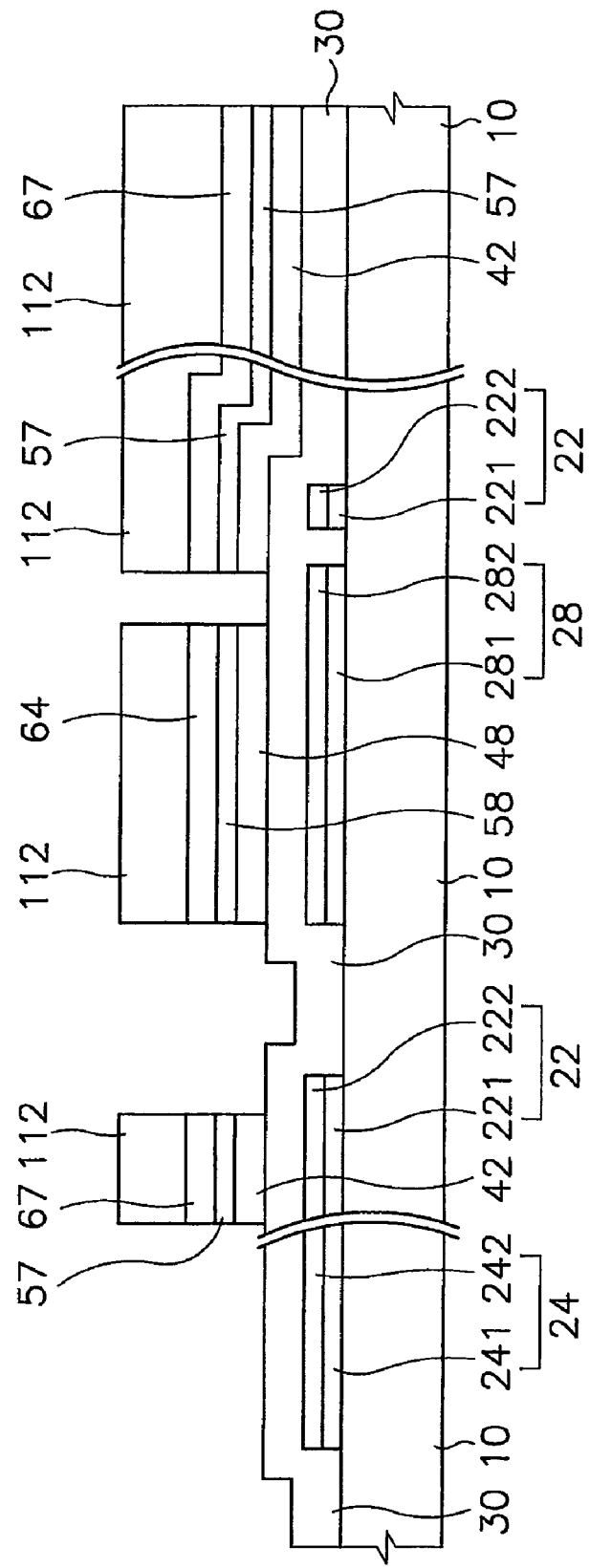
Figure 14B:
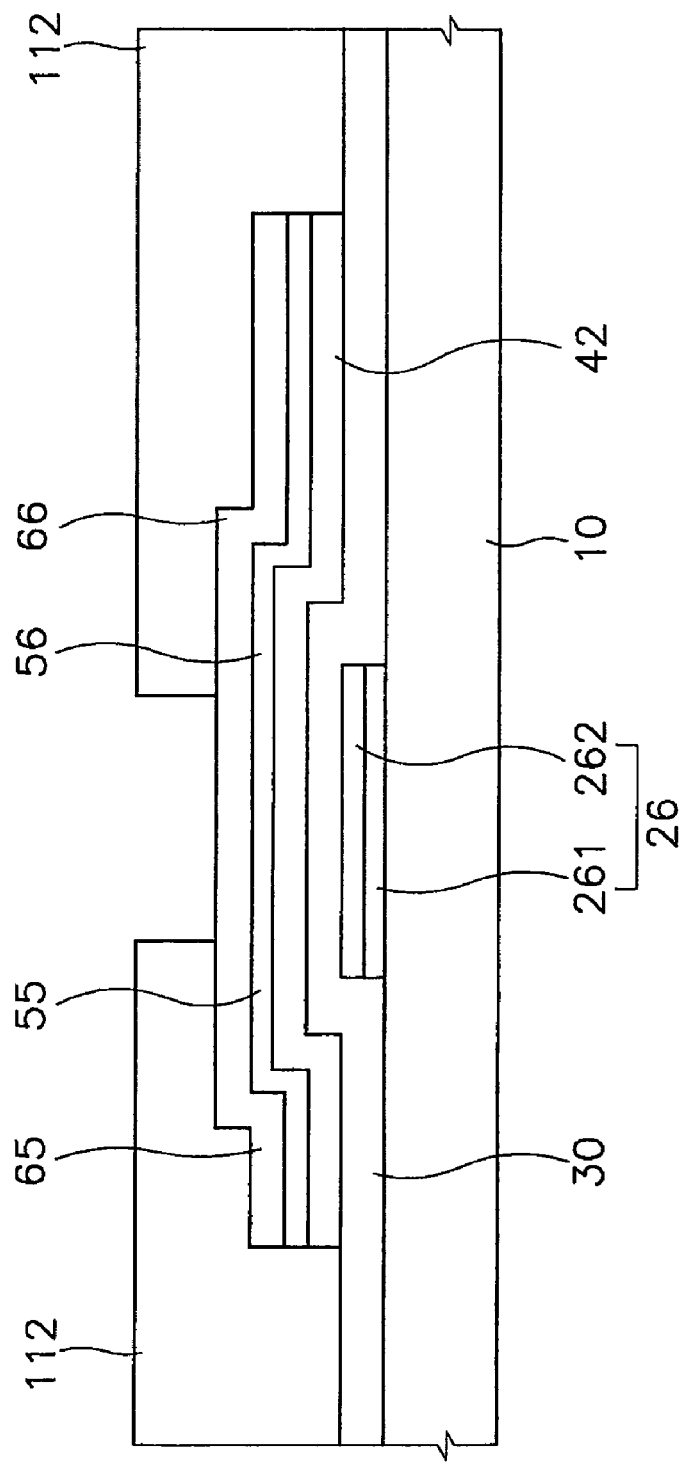

Referring to FIGS. 14A and 14B, the exposed intermediate layer 50 in the remaining region 'B', the exposed semiconductor layer 40 in the remaining region 'B' and a first region of the photoresist film are then removed by means of a dry etching. The semiconductor region 40 is disposed under the intermediate layer. During the etching, the gate insulating layer 30 is substantially not etched. An etching rate of the semiconductor layer 40 is substantially identical to an etching rate of the intermediate layer 50. Preferably, an etching rate of the photoresist patterns 112 and 114 is substantially identical to the etching rate of the semiconductor layer 40. For example, a mixed gas of $SF_6$ and HCl or a mixed gas of $SF_6$ and $O_2$ may be used. When the etching rate of the photoresist film patterns 112 and 114 is substantially identical to the etching rate of the semiconductor layer 40, a thickness of the first region 114 is no less than a summation of a thickness of the semiconductor layer 40 and a thickness of the intermediate layer 50.

A first region of the channel region 'C' is removed to expose the conductive pattern for source/drain, and an intermediate region 50 in the remaining region 'B' and a semiconductor region 40 in the remaining region 'B' are removed so that the gate insulating layer 30 is exposed. A second region 112 of the data wiring assembly 'A' is etched to decrease a thickness of the second region 112 of the data wiring assembly 'A'. Therefore, semiconductor patterns 42 and 48 are formed. An intermediate layer pattern under the conductive pattern of source/drain and an intermediate layer pattern under the conductive pattern of a storage capacitor are represented by reference numerals 57 and 58, respectively.

A remaining photoresist film on a surface of the conductive pattern of source/drain in the channel region 'C' is then removed by ashing process.

Figure 15A:
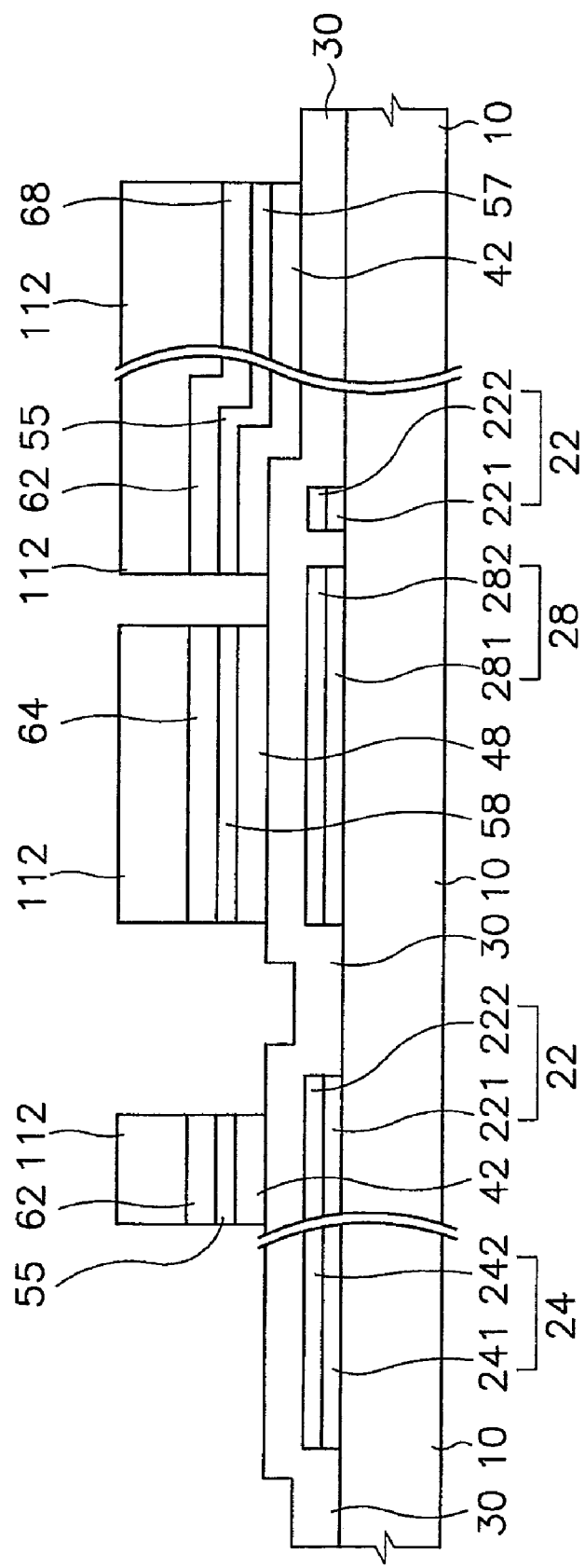
Figure 15B:
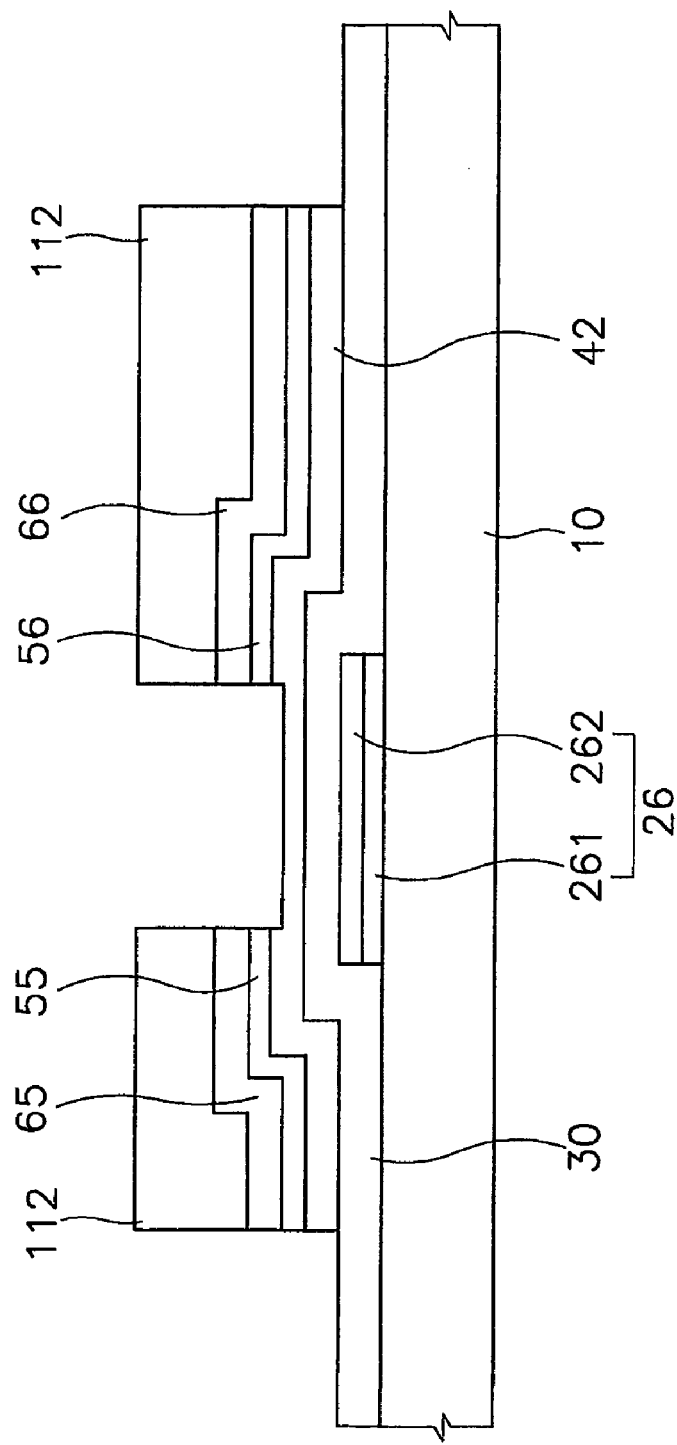

Referring to FIGS. 15A and 15B, a conductive pattern for source/drain in the channel region 'C' and an intermediate pattern for source/drain in the channel region 'C' are etched, thereby being removed. The intermediate pattern of the source/drain is disposed under the conductive pattern for the source/drain in the channel region 'C'.

The conductive pattern for the source/drain and the intermediate pattern may be dry etched. Preferably, etching selectivity between the conductive pattern for the source/drain and the intermediate pattern is big in the dry etching, because the end point detection of the dry etching is difficult in case the etching selectivity is small. Therefore, when etching selectivity is not big, a control of a thickness of the semiconductor pattern remaining in the channel region 'C' is not easy.

A dry etching may also be performed with wet etching. The conductive pattern for the source/drain may be wet etched, and the intermediate pattern 57 may be dry etched. When the dry etching is performed with the wet etching, a sidewall of the conductive pattern for the source/drain is wet etched, and the intermediate layer pattern 57 is substantially not etched, so that a stepwise shape is formed. A mixed gas of $SF_4$ and HCl, or a mixed gas of $CF_4$ and $O_2$ may be used to etch the intermediate layer pattern 57 and the semiconductor pattern 42. A semiconductor pattern having a uniform thickness may be formed by means of a mixed gas of $CF_4$ and $O_2$. Referring to FIG. 16B, a portion of the semiconductor pattern 42 may be removed to decrease a thickness of the semiconductor pattern, and a second region 112 of the photoresist film pattern may be etched to decrease a thickness of the second region 112 of the photoresist film pattern. Preferably, the gate insulating layer 30 is not etched, and a thickness of the photoresist film pattern is thick enough so that the second region 112 is not etched so that the data wirings 62, 64, 65, 66 and 68 are coated by the photoresist film pattern.

Therefore, the source electrode 65 and the drain electrode 66 are separated to form the data wirings 62, 64, 65, 66 and 68 and the contact layer patterns 55, 56 and 58. The data wirings 62, 64, 65, 66 and 68 are disposed on the contact layer patterns 55, 56 and 58.

A second region of the photoresist film remaining on the data wiring assembly 'A' is then removed. However, the second region may be removed before the conductive pattern 67 of the source/drain in the channel region 'C' is removed. The second region is removed after the intermediate layer pattern 57 under the conductive pattern 56 is removed.

As mentioned above, a dry etching may be performed solely, or a wet etching may be performed with a dry etching. When the dry etching is performed solely, manufacturing process is simple but etching condition is incontrollable. However, when the wet etching is performed with the dry etching, manufacturing process is complex, but etching condition is controllable.

Figure 16A:
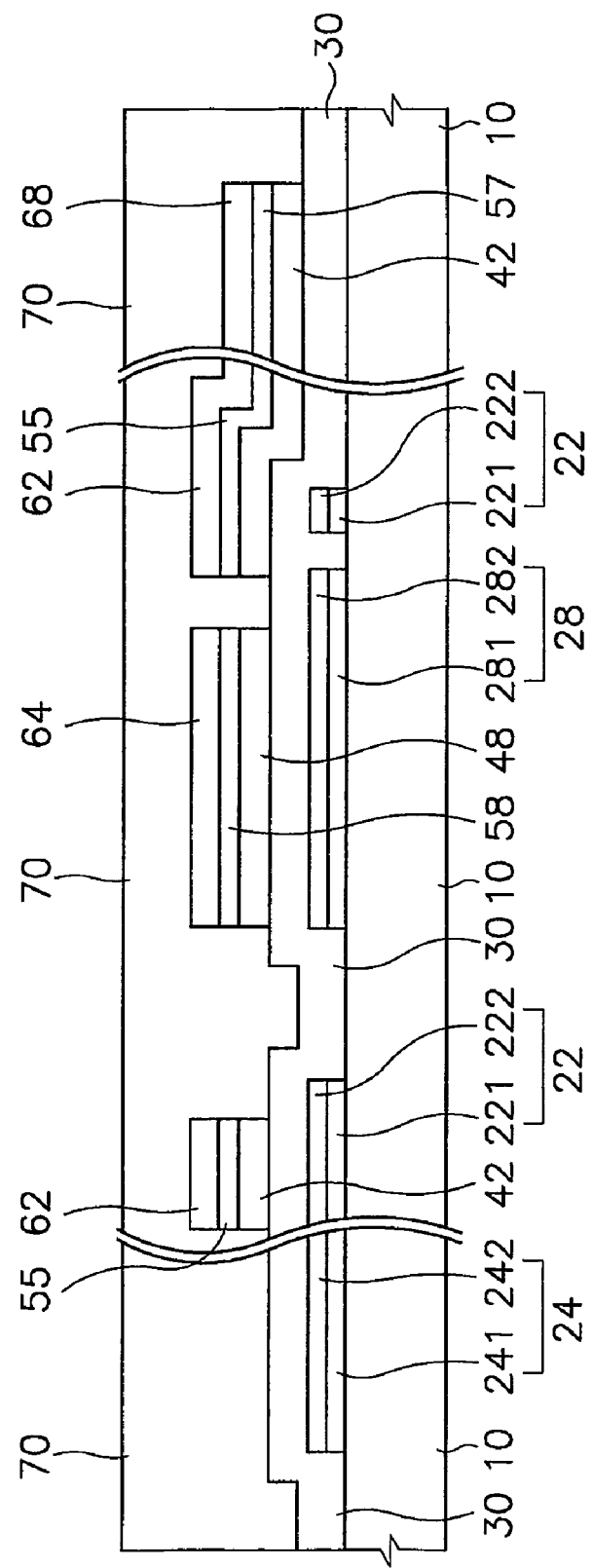
Figure 16B:
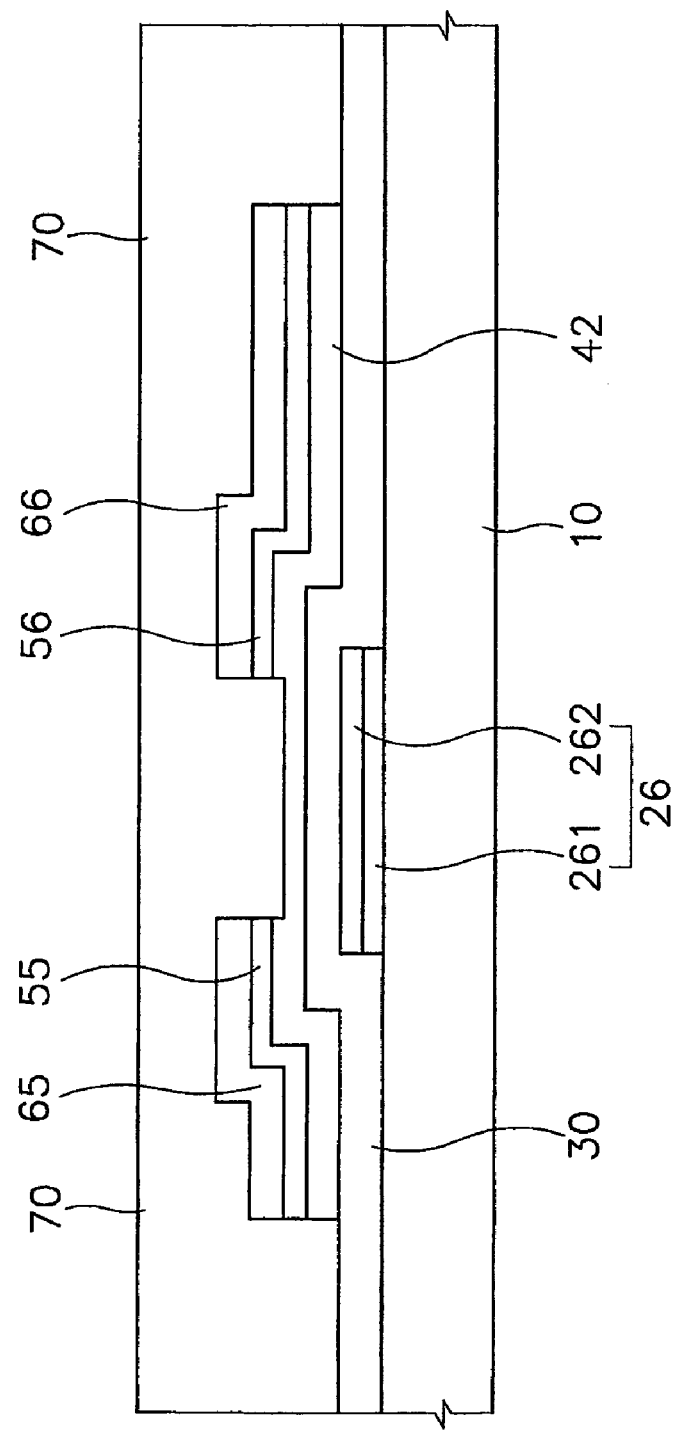

Referring to FIGS. 16A and 16B, a passivation layer 70 is then formed.

Figure 17A:
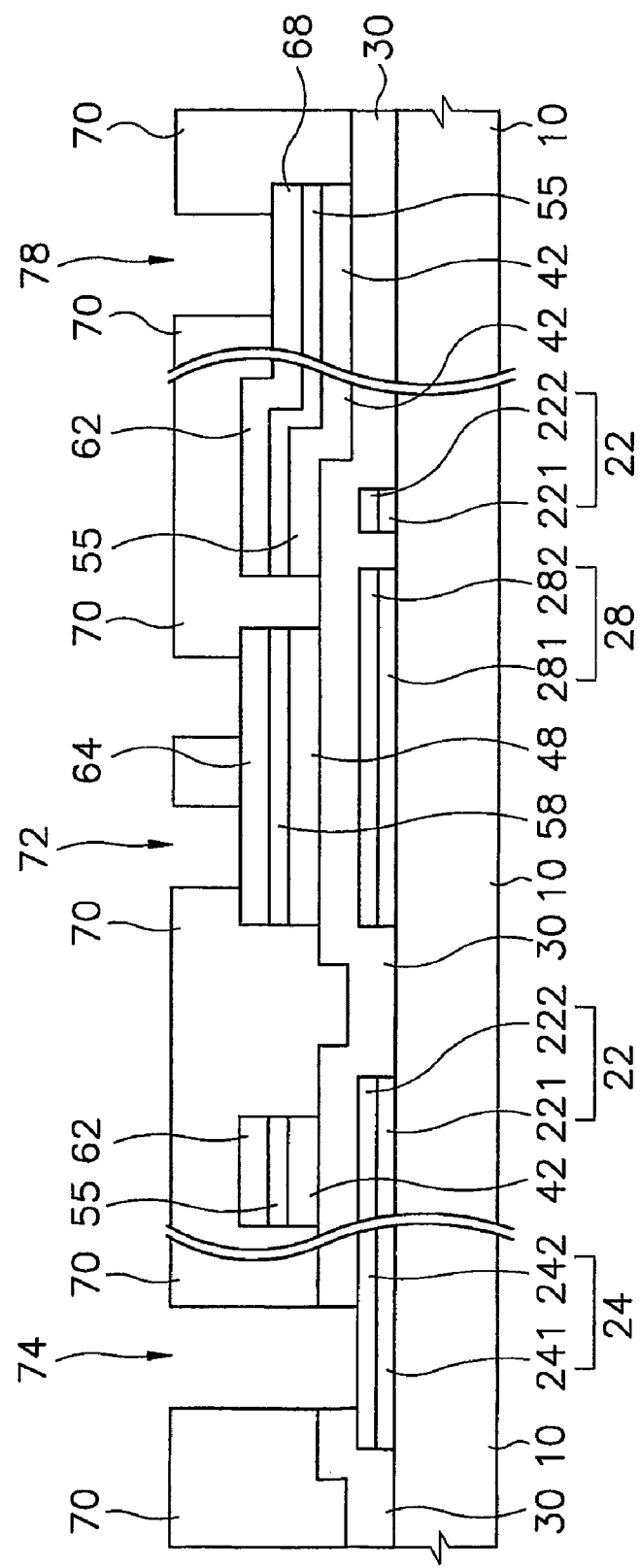
Figure 17B:
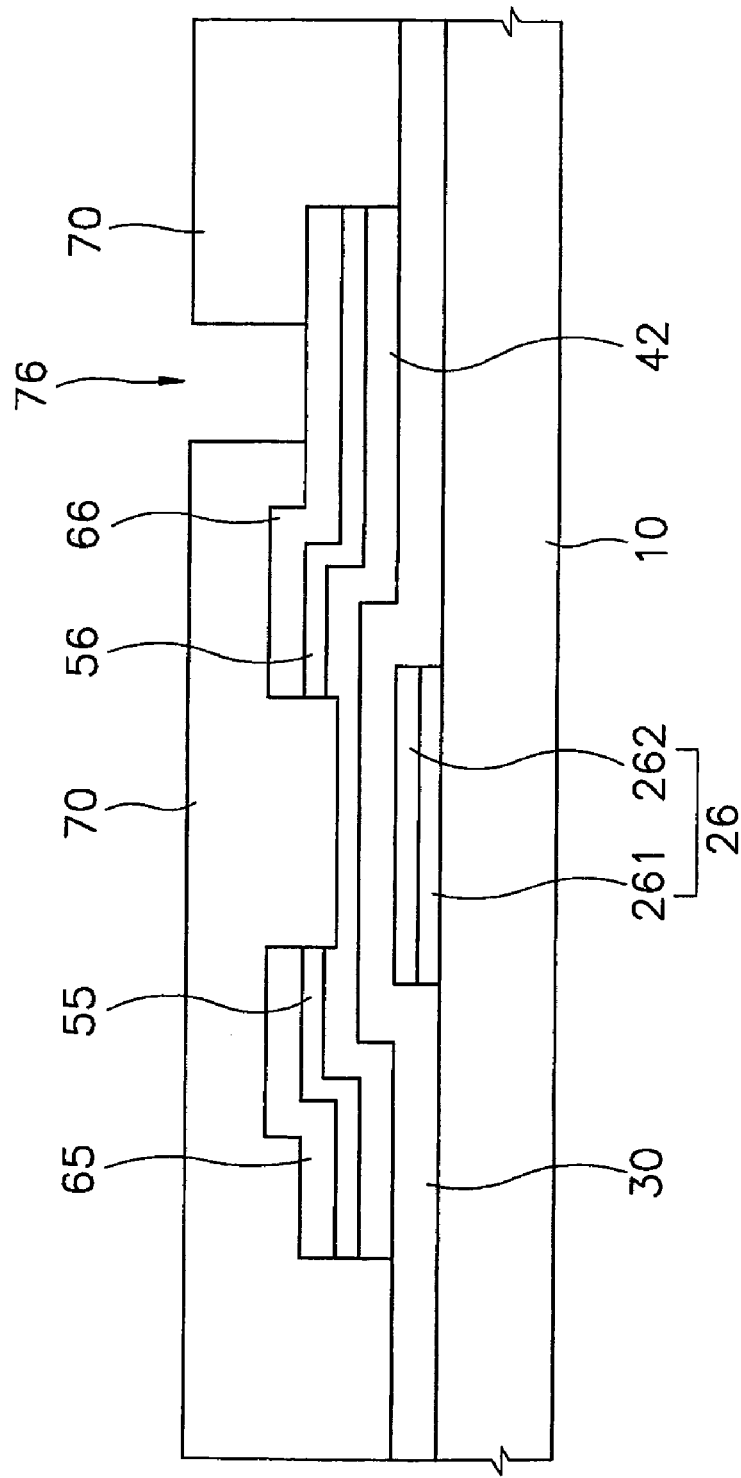

Referring to FIGS. 17A and 17B, the passivation layer 70 and the gate insulating layer 30 are etched to form contact holes 76, 74, 78 and 72 through which the drain electrode 66, the gate pad 24, the data pad 68 and the conductive pattern of a storage capacitor 64 are exposed, respectively. The etching process is performed by means of a lithography process. Dimensions of contact holes 74 and 78 are no more than about 2 mm×60 μm. The pads 24 and 68 are exposed through the contact holes 74 and 78. Preferably dimensions of the contact holes 74 and 78 are no less than about 0.5 mm×15 μm.

Referring to FIGS. 8 to 10, ITO layer is then deposited to a thickness from about 400 Å to about 500 Å. The ITO layer is then patterned. Therefore, a pixel electrode 82, an auxiliary gate pad 86 and an auxiliary data pad 88 are formed by means of a photolithography process. The pixel electrode 82 is connected to the drain electrode 66 and the conductive pattern of the storage capacitor, and the auxiliary gate pad 86 is connected to the gate pad 24. The auxiliary data pad 88 is connected to the data pad 68.

Preferably, nitrogen gas is used in a pre-heating process. The pre-heating is performed before the ITO is deposited. The nitrogen gas prevents a formation of a metal oxide layer. The metal oxide layer may be formed on an upper portion of metal layers 24, 64, 66 and 68 that are exposed through the contact holes 72, 74, 76 and 78.

According to another exemplary embodiment of the present invention, the data wirings 62, 64, 65, 66 and 68, the contact layer patterns 55, 56 and 68 and the semiconductor patterns 42 and 48 are formed using one mask, and source electrode is separated from the drain electrode, thereby simplifying manufacturing process.

A method according the exemplary embodiments of the present invention may also be applied to an AOC (Array On Color Filter) structure. In the AOC structure, TFT array is formed on color filters.

Figure 18:
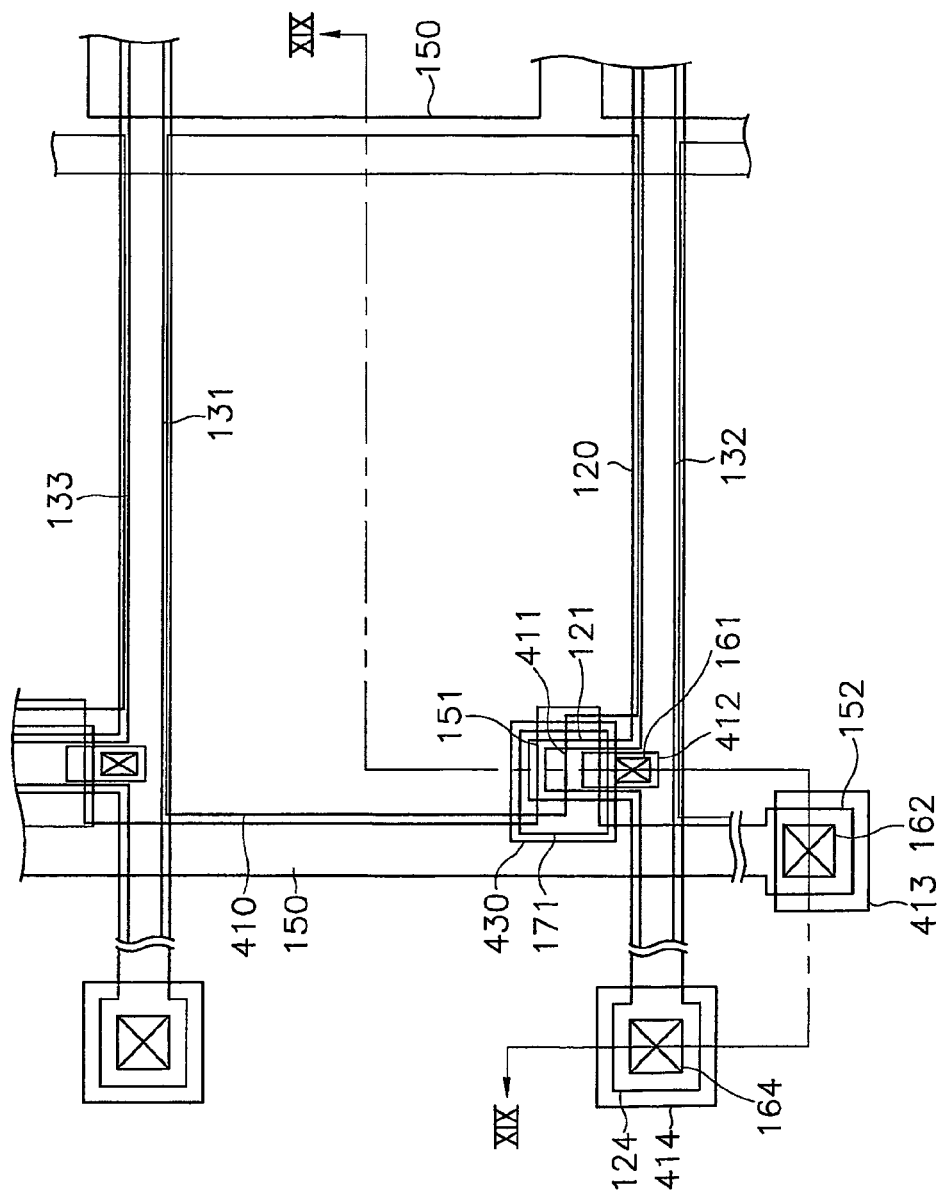
FIG. 18 is a plan view illustrating a TFT substrate for an LCD apparatus according to still another embodiment of the present invention.
Figure 19:
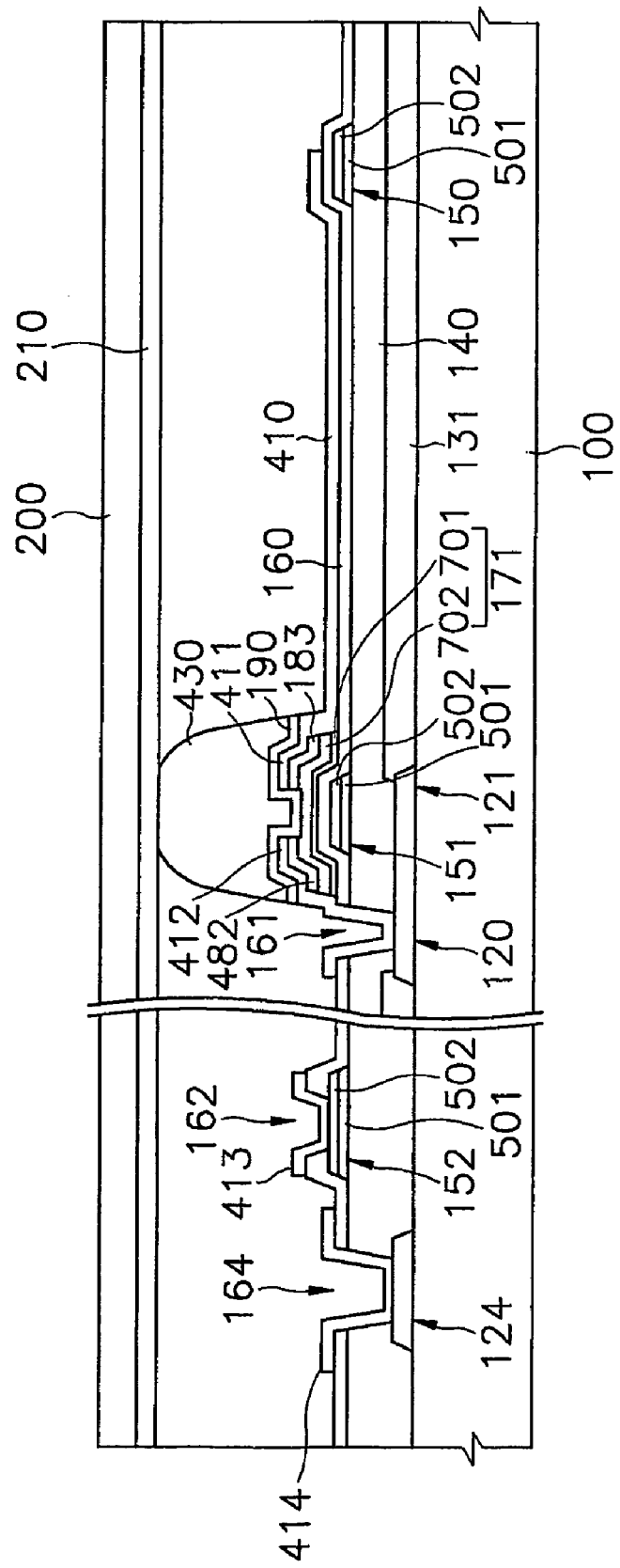
FIG. 19 is a cross-sectional view taken line of XIX-XIX' in FIG. 18.

FIG. 18 is a plan view illustrating a TFT substrate according to one embodiment of the present invention, and FIG. 19 is a cross-sectional view taken the line of XIX-XIX' in FIG. 18. In FIG. 19, there are illustrate the TFT substrate corresponding to a lower substrate and an upper substrate opposed to the lower substrate.

Referring to FIGS. 18 and 19, data wirings 120, 121 and 124 are formed on a lower insulation substrate 100. The data wirings 120, 121 and 124 include molybdenum or molybdenum-tungsten alloy.

The data wirings 120, 121 and 124 include a data line 120, a data pad 124 and a light barrier layer 121. The data line 120 extends in a horizontal direction with respect to the lower insulation substrate 100. The data pad 124 is connected to the end portion of the data line 120 to transmit an image signal to the data line 120 after receiving the image signal from outside. The light barrier layer 121 is divided from the data line 120 to block a light incident from the bottom of the lower insulation substrate 100 into a semiconductor layer 170. The light barrier layer 121 serves a black matrix that blocks the leakage of the light. Alternatively, the light barrier layer 121 may be separated from the data line 120. In one embodiment of the invention, the data wirings 120, 121 and 124 preferably include molybdenum-tungsten alloy having a low specific resistance because pixel wirings 410 and 412 the auxiliary pads 413 and 414 will be formed using indium zinc oxide (IZO).

A red (R) color filter, a blue (B) color filter and green (G) color filter are formed on the lower insulating substrate 100. Peripheral portions of the color filters 131, 132 and 133 are overlapped with a peripheral portion of the data wirings 120 and 121. The color filters 131, 132 and 133 may be formed over a data line 120.

A buffer layer 140 is formed on the data wirings 120, 121 and 124 and the color filters 131, 132 and 133. The buffer layer 140 prevents the color filters 131, 132 and 133 from outgassing, and the buffer layer 140 also prevents the color filters 131, 132 and 133 from being damaged by heat or plasma energy in subsequent processes. Because the buffer layer 140 separates the data wirings 120, 121 and 124 from the TFT array, lower dielectric constant and thicker thickness are preferable so as to decrease a parasite capacitance.

Gate wirings having a double layered structure are formed on the buffer layer 140. The double layered structure has a lower layer 501 and an upper layer 502. The lower layer 501 has a material such as aluminum and aluminum alloy, and the upper layer 502 has a material such as molybdenum and molybdenum alloy.

The gate wirings include a gate line 150, a gate pad 152 and a gate electrode 151 of a TFT. The gate line 150 extends laterally to intersect the data line 120, thereby defining a pixel. The gate pad 152 is connected to an end portion of the gate line 150 and receives an image signal from outside to transmit the image signal to the gate line 150. The gate line 150 has the gate electrode 151 of TFT.

The gate line 150 is overlapped with a pixel electrode 410 to form a storage capacitor that improves storage capacitance of the pixel. When the storage capacitance formed by overlap of the gate line 150 and the pixel electrode 410 is not enough, a common electrode for a storage capacitor may be formed.

Preferably, when gate wirings are formed in a multi-layered structure, one layer has low resistance and another layer has high adhesiveness. A double layered structure may have Al (or aluminum alloy) and MoW.

A gate insulating layer 160 deposited at a low temperature is formed on the gate wirings 150, 151 and 152 and the buffer layer 140. The gate insulating layer 160 deposited at low temperature may have an organic insulating layer, an amorphous silicon oxide layer formed at a low temperature or an amorphous silicon nitride layer formed at a low temperature. Color filters are formed on the lower substrate of a TFT structure according to another exemplary embodiments of the present invention. A gate insulating layer is not deposited at a high temperature, but a gate insulating layer is deposited at a low temperature such as a temperature not more than or equal to about 250° C.

A semiconductor layer 171 of a double layered structure is formed on the gate insulating layer 160 of the gate electrode 151. The semiconductor layer 171 of the double layered structure has an island shape. A lower semiconductor layer 701 of the semiconductor layer 171 includes amorphous silicon having a high band gap energy, and an upper semiconductor layer 702 of the semiconductor layer 171 includes amorphous silicon having a lower band gap energy than the band gap energy of the lower semiconductor layer 701. For example, a band gap energy of the lower semiconductor layer 701 may be from about 1.9 eV to about 2.1 eV, and a band gap energy of the upper semiconductor layer 702 may be from about 1.7 eV to about 1.8 eV. A thickness of the lower semiconductor layer 701 may be from about 50 Å to about 200 Å, and a thickness of the upper semiconductor layer 702 may be from about 1,000 Å to about 2,000 Å.

A band gap energy offset is formed between the upper semiconductor layer 702 and the lower semiconductor layer 701. The lower semiconductor layer 701 has different band gap from the upper semiconductor layer 702. The band gap energy offset is substantially identical to a difference of the band gap energy. When the TFT is turned-on, a channel is formed in a band offset region disposed between the lower semiconductor layer 701 and the upper semiconductor layer 702. Atomic structures of the band offset region are substantially identical to each other so that the band offset region has fewer defects. Therefore, characteristics of a TFT are improved. The semiconductor layer 171 may have a mono layered structure.

Ohmic contact layers 182 and 183 are formed on the semiconductor layer 171. The ohmic contact layers 182 and 183 have n+ amorphous silicon, n+ microcrystalline silicon or an n+ metal silicide doped with impurities by a high concentration, and the ohmic contact layers 182 and 183 are separated from each other.

Pixel wirings 410, 411 and 412 are formed on the ohmic contact layers. The pixel wirings 410, 411 and 412 have a source electrode 412, a drain electrode 411 and a pixel electrode 410. The source electrode 412 is connected to a data line 120 through a contact hole 161 that is formed in a gate insulating layer 160 and a buffer layer 140. The drain electrode 411 is connected to the pixel electrode 410, and transmits an image signal from the TFT to the pixel electrode. The pixel wirings 410, 411 and 412 have indium tin oxide (ITO). The ITO is a transparent conductive material.

An auxiliary gate pad 413 and an auxiliary data pad 414 are connected to the gate pad 152 and the data pad 124 through contact holes 162 and 164, respectively. The auxiliary gate pad 413 and the auxiliary data pad 414 are formed as a layer substantially identical to the pixel wirings 410, 411 and 412. The auxiliary gate pad 413 makes direct contact with a molybdenum-tungsten alloy layer, and the auxiliary data pad 414 makes direct contact with a copper alloy layer. The molybdenum-tungsten alloy layer is an upper layer 502 of the gate pad 152, and the copper alloy layer is an upper layer 202 of the data pad 124. The pixel electrode 410 is overlapped with a gate line 150 adjacent to the pixel electrode 410 and a data line 120 adjacent to the pixel electrode 410, thereby increasing the aperture ratio. The pixel electrode 410 may not be overlapped with the gate line 150 or the data line 120.

A passivation layer 190 is formed on the source electrode 412 and a drain electrode 411, and a photoresist color organic layer 430 is formed on the passivation layer 190. The passivation layer 190 protects the TFT. The photoresist color organic layer 430 has a deep color and a good light absorbance. The color organic layer 430 masks a light incident into the semiconductor layer 171 of the TFT, and the color organic layer 430 controls a height of the color organic layer 430. Therefore, the color organic layer 430 maintains an interval between the lower insulating substrate 100 and an upper insulating layer facing the lower insulating substrate 100. That is, the color organic layer 430 is used as a spacer. The passivation layer 190 and the organic layer 430 may be formed along the gate line and the data line 120, respectively. The organic layer 430 may also mask a light that is leaked adjacent to the gate wirings and the data wirings.

The upper substrate 200 has ITO or IZO, and a common electrode 210 is formed over the upper substrate 200. The common electrode 210 generates an electric field with the pixel electrode 410.

Hereinafter, referring to FIGS. 19 to 28, a method of manufacturing the TFT substrate according another exemplary embodiment of the present invention will be disclosed.

Figure 20:
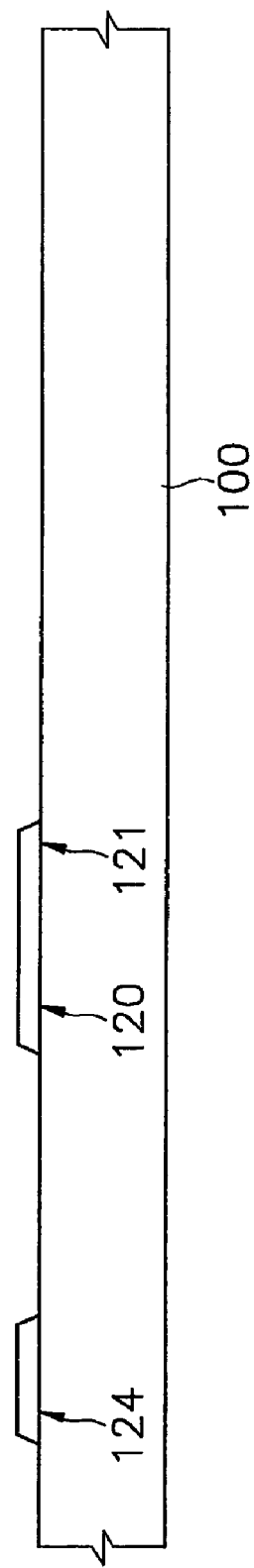
FIGS. 20 to 27 are cross-sectional views illustrating a method of manufacturing the TFT substrate shown in FIG. 19.

Referring to FIG. 20, a conductive material having a good adhesion property, for example, ITO is deposited on a lower insulation substrate 100. The conductive material is deposited via a sputtering process. The conductive material is etched using a dry etching process or a wet etching process. Thus, data wirings are formed on the lower insulation substrate 100. The data wirings include a data line 120, a data pad 124 and a light barrier layer 121.

Figure 21:
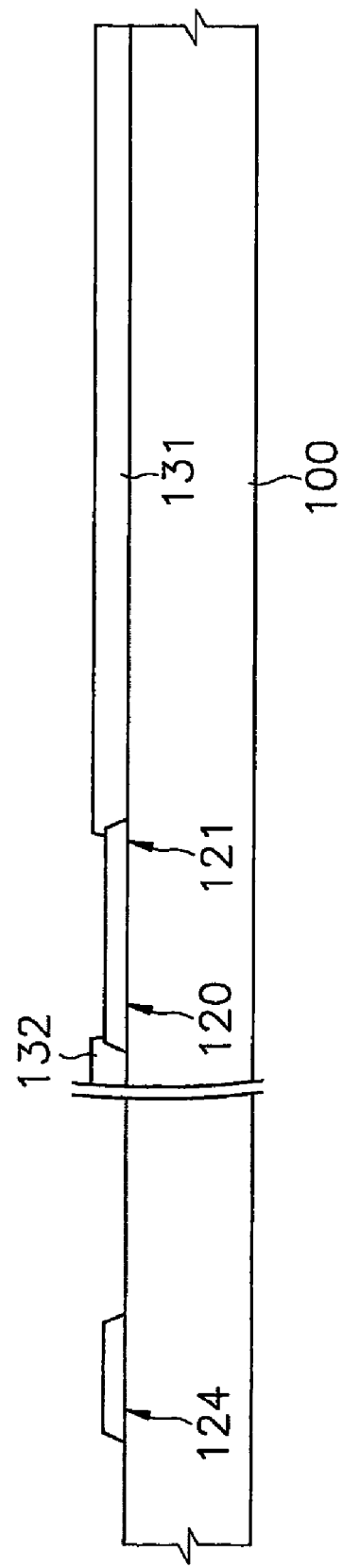
Figure 22:
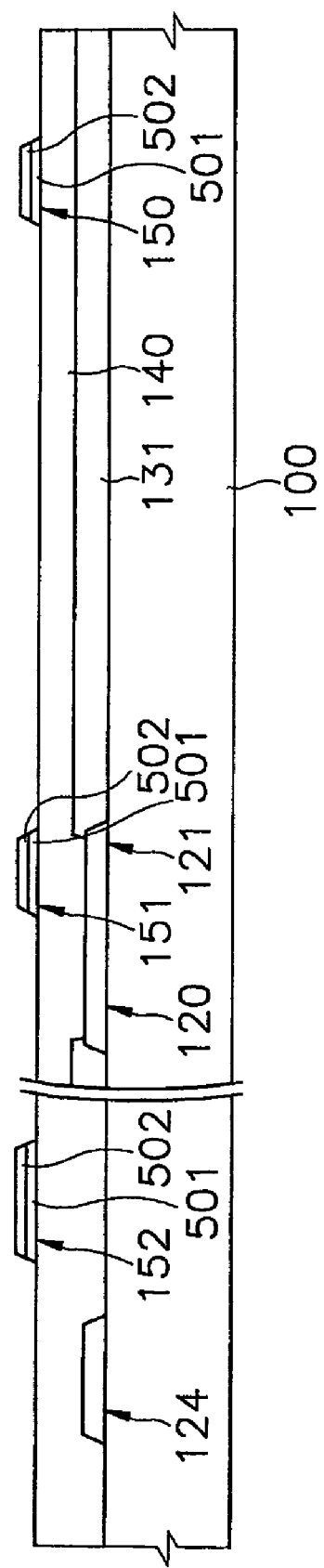

Referring to FIG. 21, photoresist materials including a red (R) colorant, a green (G) colorant and a blue (B) colorant are then coated successively and patterned. Therefore, an R color filter 131, a G color filter 132 and a B color filter 133 are formed by means of a photo process using masks, successively.

Then, three masks are used to form the R color filter 131, the G color filter 132 and the B color filter 133. However, one mask may be used to form the R color filter 131, the G color filter 132 and the B color filter 133, thereby reducing cost. A laser photo process or a printing method may also be used without a mask, thereby minimizing cost. Preferably, peripheral portions of the color filters 131, 132 and 133 are overlapped with a peripheral portion of the data line 120.

As shown in FIG. 21, a buffer layer 140 is formed on the lower insulation substrate 100. Conductive layers including Cr and Al are successively formed on the buffer layer 140, and a photoresist pattern (not shown) including novolak is formed on the conductive layers. After the Al layer is patterned using the photoresist pattern as an etching mask, the photoresist pattern is removed using a stripping composition acetic acid and ozone gas contained in the acetic acid as bubble shapes. The Cr layer is patterned to form the gate wirings including the gate line 150, the gate electrode 151 and the gate pad 152 on the buffer layer 140. Here, the gate wirings may include one layer of a Cr layer or an Al layer.

Figure 23:
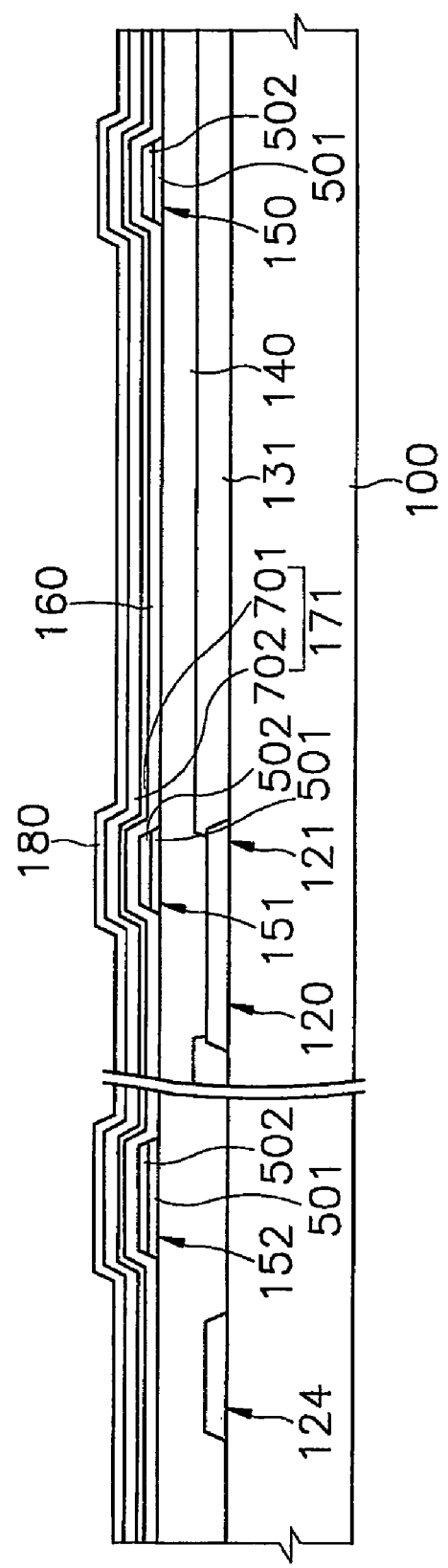

Referring to FIG. 23, a gate insulating layer 160 deposited at a low temperature, a first amorphous silicon layer 701, a second amorphous silicon layer 702 and a doped amorphous silicon layer 180 are then deposited successively on the gate wirings 150, 151 and 152 and the buffer layer 140.

The gate insulating layer 160 has an organic insulating layer, an amorphous silicon oxide layer deposited at a low temperature and an amorphous silicon nitride layer deposited at a low temperature. The gate insulating layer 160 may be deposited at a low temperature such as a temperature no more than about 250° C.

The first amorphous silicon layer 701 includes an amorphous silicon having a band gap energy of from about 1.9 eV to about 2.1 eV, and the second amorphous silicon layer 702 includes an amorphous silicon having a band gap energy of from about 1.7 eV to about 1.8 eV. The first amorphous silicon layer 701 is deposited by means of a chemical vapor deposition (CVD) using a $SiH_4$ gas that has $CH_4$ gas, $C_2H_2$ gas or $C_2H_6$ gas of predetermined amount. The $SiH_4$ is used to form an amorphous silicon. For example, the $SiH_4$ gas and $CH_4$ gas are applied to the CVD in a ratio of 1 to 9, thereby depositing an amorphous silicon layer including carbon at a concentration of about 50 at % and a band gap energy of from about 2.0 eV to about 2.3 eV. The band gap energy of an amorphous silicon layer is dependent on a condition of deposition process, and the band gap energy may be between about 1.7 eV and about 2.5 eV corresponding to an amount of a carbon compound.

The gate insulating layer 160 deposited at a low temperature, the first amorphous silicon layer 701, the second amorphous silicon layer 702 and the doped amorphous silicon layer 180 may be deposited successively in situ by means of the CVD.

Figure 24:
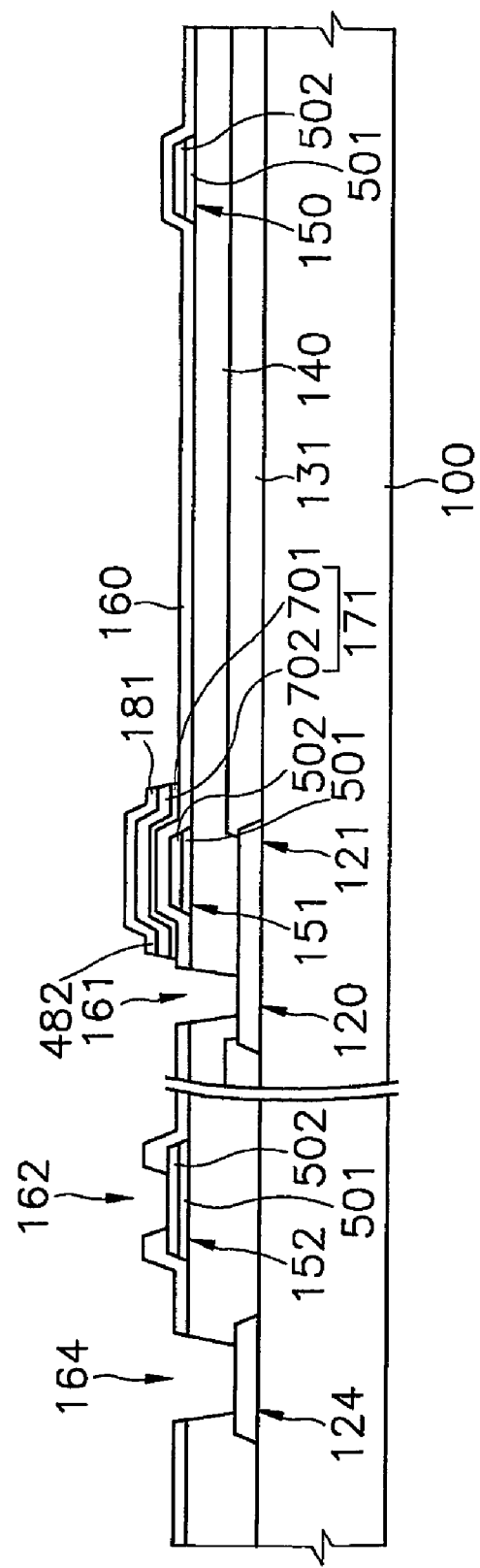

Referring to FIG. 24, the first amorphous silicon layer 701, the second amorphous silicon layer 702 and the doped amorphous silicon layer 180 are patterned. Therefore, a semiconductor layer 171 of an island shape, an ohmic contact layer 181 and contact holes 161, 162 and 164 are formed by means of a photolithography process using a mask. The contact holes 161, 162 and 164 are disposed on the gate insulating layer 160 deposited at a low temperature and the organic insulating layer 140. The data line 120, the gate pad 152 and the data pad 124 are exposed through the contact holes 161, 162 and 164, respectively.

A first amorphous silicon layer 701, a second amorphous silicon layer 702 and a doped amorphous silicon layer 180 are then removed except a portion of the layers 701, 702 and 180 disposed on the gate electrode 151. A portion of the layers 701, 702 and 180 on the gate pad 152 and a portion of the gate insulating layer 160 on the gate pad 152 are removed. A portion of the layers 701, 702, 180 and 160 on the data line 120 and the data pad 124 are removed. A portion of the organic insulating layer 140 on the data line 120 and the data pad 124 are also removed.

In order to perform a photolithography process using only one mask, a photoresist film pattern having portions of different thickness is used as an etching mask.

Figure 25:
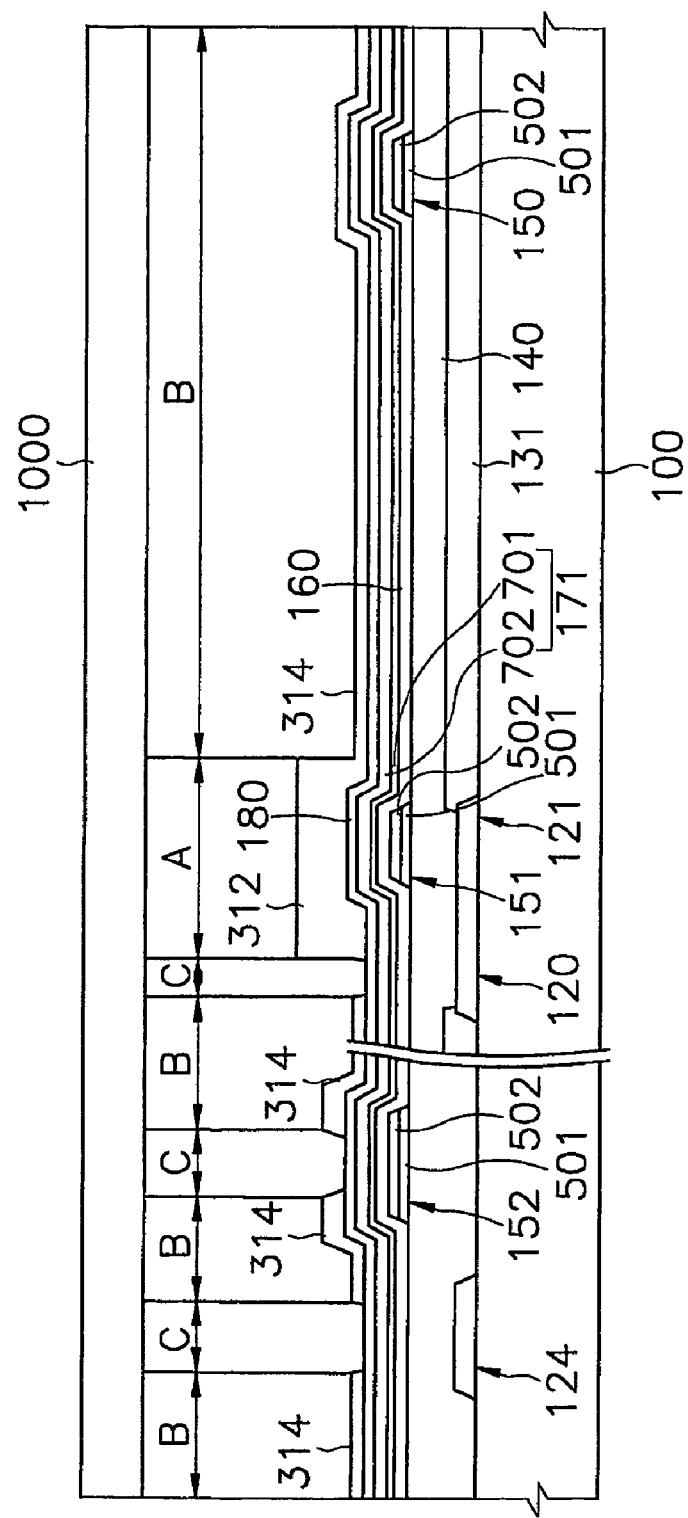

Referring to FIG. 25, a photoresist film is coated on an upper portion of the doped amorphous silicon layer 180. The thickness of the photoresist film is between about 1 μm and about 2 μm. Photoresist film patterns 312 and 314 are then formed by means of a photo process. The photo process has an exposure process using a mask and a developing process.

A first region 312 is thicker than a second region 314. A portion of the photoresist film disposed on the data line 120, the data pad 124 and the gate pad 152 are removed. The first region 312 is disposed on the gate electrode 151. Preferably, the ratio of the first region 312 to the second region 314 is no more than about a half. The remaining thickness of the photoresist film of the first region 312 may be no more than about 4,000 Å.

Various methods may be used to form a photoresist film pattern having portions of different thickness. Hereinafter, a positive photoresist film is used.

When the photoresist film is exposed through the mask, polymers at a portion of the photoresist film directly exposed by the light are fully decomposed, polymers at a portion of the photoresist film, on which the translucent film is disposed, are partially decomposed, and polymers at a masked portion of the photoresist film are not decomposed.

When the photoresist film is developed, a portion in which high polymers are not decomposed remains. Therefore, a thickness of photoresist film in partially exposed portion is thinner than a thickness of photoresist film in unexposed portion. When exposing time is too long, all the high polymers are decomposed. Therefore, controlling the exposing time is required so that all the high polymers are not decomposed.

When the photoresist film is developed, polymers in the first region 312 remain, polymers in the second region 314 are partially removed so that a thickness of the second region 314 is thinner than a thickness of the first region 312, and polymers in the region 'C' are fully removed. The second region 314 is partially exposed by the light. Therefore, a photoresist film pattern having portions of different thickness is formed.

Figure 26:
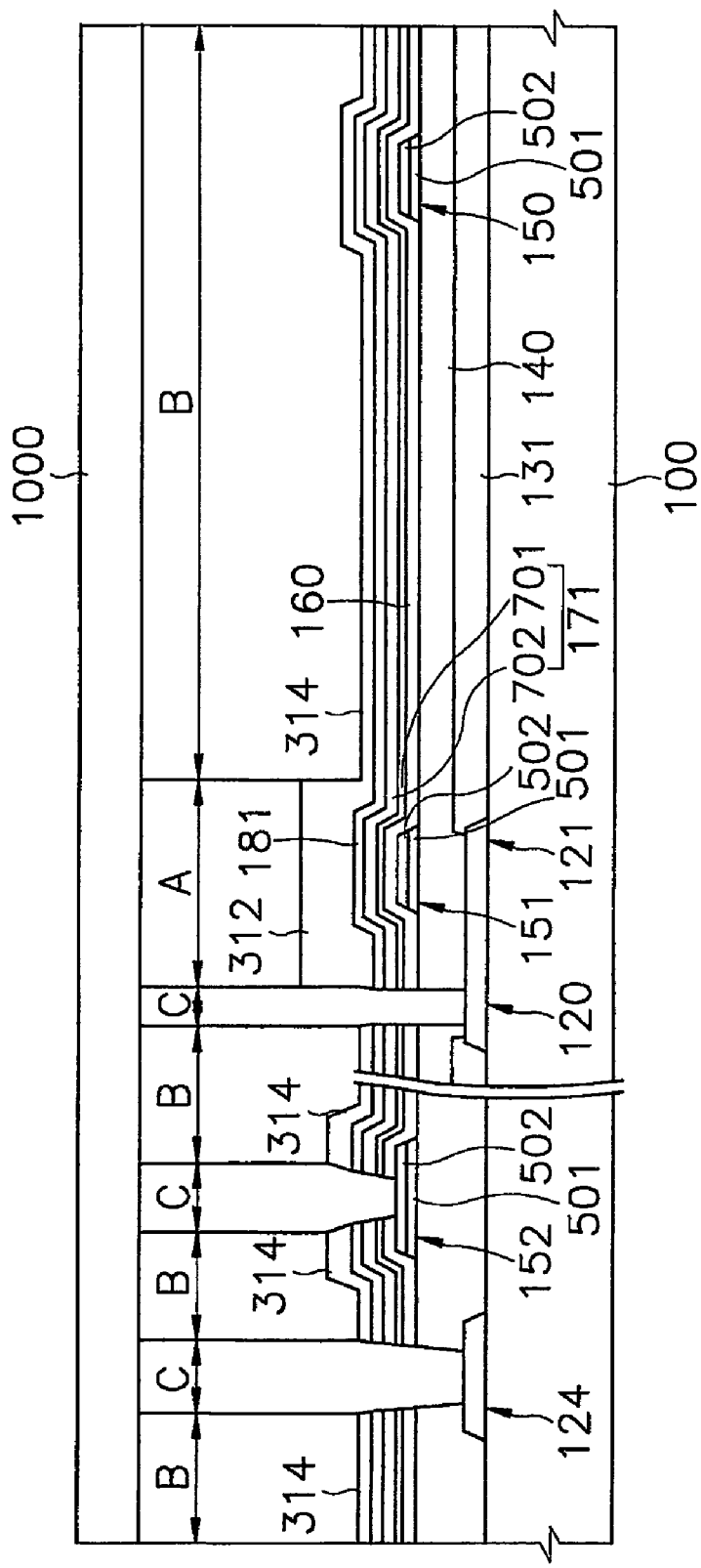

Referring to FIG. 26, the doped amorphous silicon layer 180, the second amorphous silicon layer 702, the first amorphous silicon layer 701 and the gate insulating layer 160 deposited at a low temperature are then dry etched to form a contact hole 162 exposing the gate pad 152 and to expose the buffer layer 140 of the region 'C'. The buffer layer 140 of the region 'C' is dry etched to form contact holes 161 and 164, through which the data line 120 and the data pad 124 are exposed. The dry etching is performed by means of the photoresist film patterns 312 and 314 as an etching mask.

The second region 314 of the photoresist film is then fully removed by means of an ashing process using oxygen.

Therefore, the second region 314 of the photoresist film pattern is removed, the doped amorphous silicon layer 180 is exposed, and a thickness of the first region 312 of the photoresist pattern decreases to be substantially identical to a thickness of the second region 314 of the photoresist pattern.

The doped amorphous silicon layer 180, the first amorphous silicon layer 701 and the second amorphous silicon layer 702 are then etched by means of the first region 312 of a remaining photoresist pattern as an etching mask. Therefore, the doped amorphous silicon layer 180, the first amorphous silicon layer 701 and the second amorphous silicon layer 702 are removed, and the semiconductor layer 171 and the ohmic contact layer 181 remain. The semiconductor layer 171 having an island shape is formed on the gate insulating layer 160 under which the gate electrode is formed. The gate insulating layer 160 is disposed on the gate electrode 151.

The first region 312 of the remaining photoresist pattern is then removed. An ashing process using oxygen may be used to remove the first region 312 of the remaining photoresist pattern.

Figure 27:
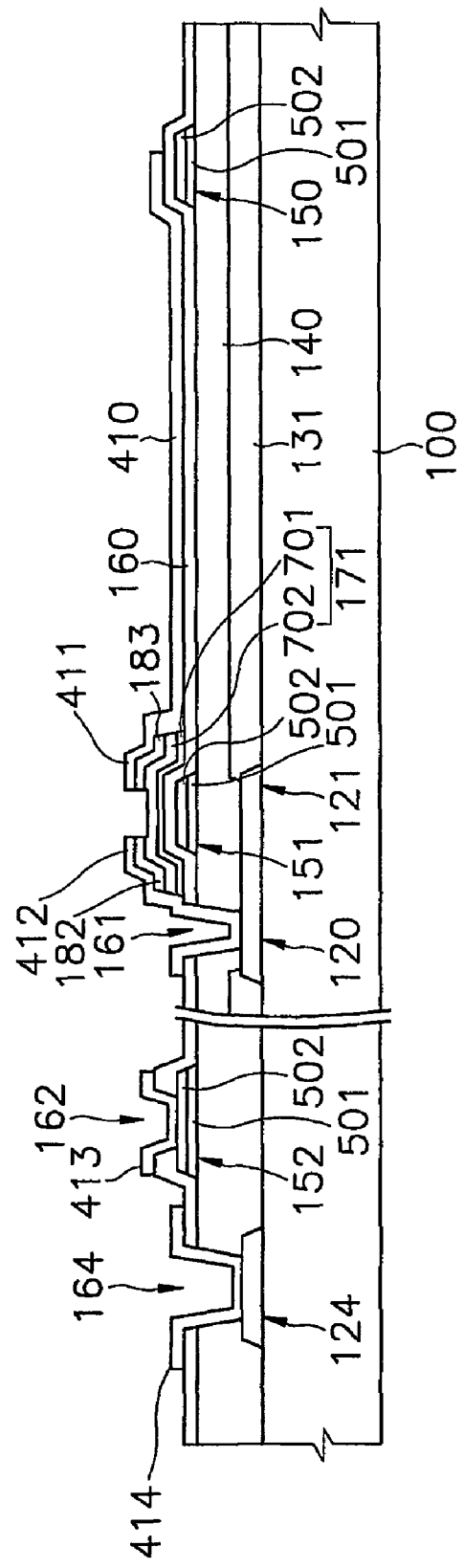

Referring to FIG. 27, an ITO layer is then deposited and patterned. Therefore, a pixel electrode 410, a source electrode 412, a drain electrode 411, an auxiliary gate pad 413 and an auxiliary data pad 414 are formed by means of a photolithography process using a mask.

The ohmic contact layer 181 is etched by means of the source electrode 412 and the drain electrode 411 as an etching mask, thereby forming an ohmic contact layer pattern and exposing the semiconductor layer 171. The ohmic contact layer 181 is disposed between the source electrode 412 and the drain electrode 411. The ohmic contact layer patterns 182 and 183 have a first region 182 and a second region 183 that is separated from the first region 182. The semiconductor layer 171 is disposed between the source electrode 412 and the drain electrode 411.

Referring to FIGS. 18 and 19, a first insulating layer such as silicon nitride or oxygen nitride and a second insulating layer such as a photoresist organic material including a black colorant are deposited on the lower insulating substrate 100 successively, and a color organic layer 430 is formed by means of a photo process using a mask. The photo process has an exposure process and a developing process. The first insulating material and the second insulating material are etched by means of the color organic layer 430 as an etching mask to form a passivation layer 190. The color organic layer 430 may mask a light incident into a TFT. The black matrix 121 masks the leaked light, and the black matrix 121 may be separated from the data line 120 to form a disconnected wiring. The black matrix 121 has a function substantially identical to a black matrix that masks the leaked light. The black matrix 121 may also be formed on the gate wirings or the data wirings to mask a light that is leaked adjacent to the gate wirings and the data wirings. The black matrix 121 may also be used as a spacer by means of a height control of the organic layer 430.

A transparent conductive material such as ITO or IZO is stacked on the upper insulating substrate 200 to form a common electrode 210.

When a conventional stripping process is performed on a photoresist pattern formed on a substrate having a large size, the photoresist pattern may not be completely removed using the conventional stripping process. The stripping process using the stripping apparatus is irreversible and the speed of the stripping process is controlled by the reaction rate.

Figure 28:
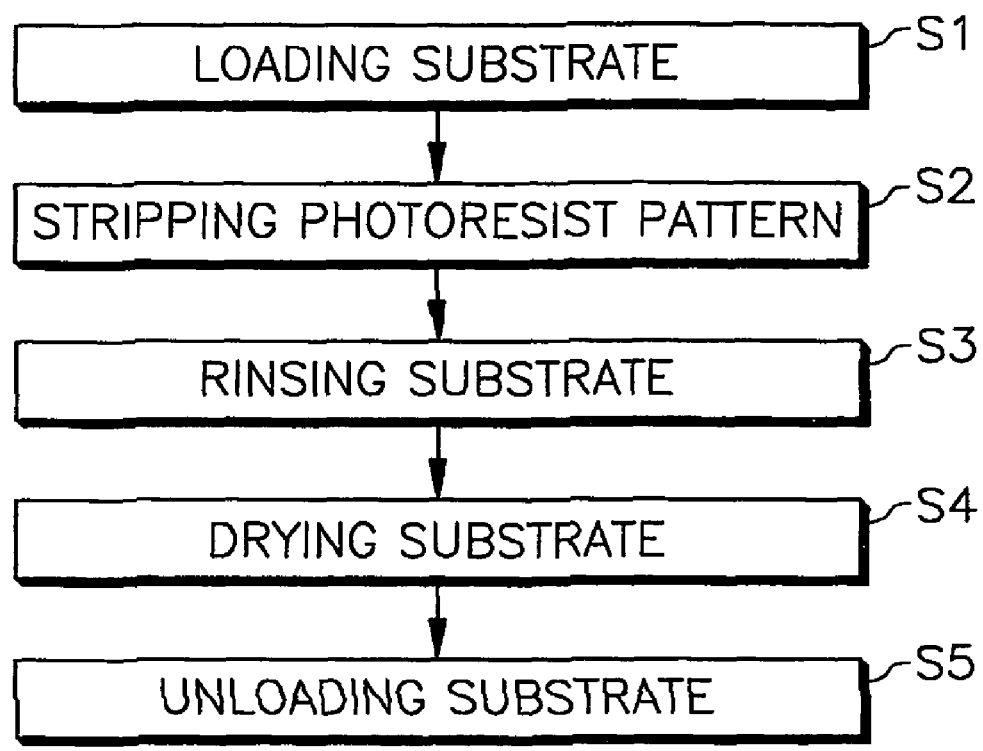
FIG. 28 is a flow chart illustrating a stripping process for a photoresist pattern formed on a substrate.

Referring to FIG. 28, in step S1, a substrate is loaded into a stripping apparatus. In step S2, a stripping composition wets the substrate in a slow carrying area to strip a photoresist pattern on the substrate. The stripping composition includes acetic acid and ozone gas. Preferably, a concentration of the ozone gas included in the acetic acid is about 80,000 to about 90,000 ppm. After the stripping process is completed, the substrate is rinsed using distilled water to remove the photoresist pattern in step S3. After the substrate is dried in step S4, the substrate is unloaded from the stripping apparatus in step S5. The steps S1 to S5 take a time of about 55 seconds. The slow carrying area is divided into three regions in accordance with the carrying speed of the substrate. The substrate is carried in a first region by a carrying speed of about 6 m/minute, and then is carried in a second region by a carrying speed of about 0.8 m/minute. In addition, the substrate is carried in a third region by a carrying speed of about 6 m/min. This stripping process may be preferably employed for a substrate having dimensions of about 300×400 mm. However, when the stripping process is performed on a large substrate having dimensions of above about 550×650 mm, the first half portion of the substrate is sufficiently immersed with the stripping composition including acetic acid and ozone gas whereas the second half portion of the substrate may not be immersed with the stripping composition. Thus, the photoresist pattern on the second half portion may not be completely removed during the stripping step. To settle this problem, the stripping process may be performed twice on the substrate, a buffering step may be additionally carried out between the stripping step and the rinsing step, or the striping step may be reversibly performed in the stripping apparatus. Therefore, the stripping composition of the present invention can advantageously remove the photoresist pattern formed on a large substrate using the above-mentioned process.

Experimental Embodiment 1

In the experimental embodiment 1, the same elements denote the same elements in the exemplary embodiment, and thus the detailed descriptions of the same elements will be omitted.

The stripping composition according to the exemplary embodiment of the present invention was sprayed onto a substrate having a photoresist pattern through a nozzle. The stripping composition wetted the photoresist pattern to decompose the photoresist pattern. The decomposed photoresist pattern was rinsed using ultra pure water so that the photoresist was completely removed from the substrate.

The stripping rate of the stripping composition containing the ozone and the acetic acid was about 6 μm/min.

Comparative Embodiment 1

In the comparative embodiment 1, the same elements denote the same elements in the exemplary embodiment, and thus the detailed descriptions of the same elements will be omitted except the stripping composition including an acetic acid and a ultra pure water.

The stripping rate of the stripping composition containing the ozone and the ultra pure water was about 0.1 μm/min, whereas the stripping rate of the stripping composition according to the experimental embodiment 1 of the present invention was about 6 μm/min. That is, the stripping rate of the stripping composition according to the experimental embodiment 1 of the present invention was greatly superior to that of the stripping composition including the ozone and the ultra pure water.

Experimental Embodiment 2

In the experimental embodiment 2, the same elements denote the same elements in the exemplary embodiment of the present invention, and thus the detailed descriptions of the same elements will be omitted.

The $O_2$ ashing process was omitted before etching the chromium layers using the stripping composition according to the present invention. Therefore, a time for end point detection (EPD) was reduced to 30 seconds.

Comparative Embodiment 2

In the comparative embodiment 2, the same elements denote the same elements in the exemplary embodiment, and thus the detailed descriptions of the same elements will be omitted except a conventional stripping composition being SC2002.

When the conventional stripping composition, that was SC2002 produced by Dongjin Semichem Ltd. in Korea, was employed for etching the chromium layers, a time for EDP using the SC2002 was 50 seconds, whereas a time for EDP using the stripping composition according to the exemplary embodiment of the present invention was 30 second, because the $O_2$ ashing process was performed in the comparative embodiment 2. The SC2002 included by about 9 weight percent of N-ethyl methyleamine, by about 39 weight percent of N-methyle pyrrolidone, by about 49 weight percent of Butyl diglycol, and by about 3 weight percent of gallic acid.

INDUSTRIAL APPLICABILITY

As described above, when the stripping composition of the present invention is used to remove the remaining photoresist pattern on a substrate after etching process, the photoresist pattern is easily removed without an adverse effect. The stripping composition of the invention is cheap, and more effectively protects the environment in comparison with the conventional stripping compositions such as an organic solvent or an alkali solution. Additionally, an $O_2$ ashing process performed before or after a stripping process may be omitted to thereby simplify the stripping process because the stripping composition includes acetic acid and ozone gas.

Although exemplary embodiments of the present invention have been described, it is understood that the present invention should not be limited to exemplary embodiments but various changes and modifications can be made by one ordinary skilled in the art within the spirit and scope of the present invention as hereinafter claimed.

The invention claimed is:

1. A method of forming a pattern, the method comprising:
    forming a photoresist pattern including novolak on a layer formed on a substrate;
    etching the layer using the photoresist pattern using as a mask to form a pattern on the substrate; and
    removing the photoresist pattern using a stripping composition including an acetic acid and an ozone gas included in the acetic acid in the form of a bubble, wherein a pH of the stripping composition is about 1.6 to about 5, and wherein a concentration of the ozone gas included in the acetic acid is about 80,000 to about 90,000 ppm.

2. The method of claim 1, wherein the stripping composition is prepared by bubbling the ozone gas in the acetic acid.

3. The method of claim 1, wherein the removing the photoresist pattern further comprises:
    spraying the stripping composition onto the photoresist pattern to wet the photoresist pattern; and
    rinsing the photoresist pattern.

4. The method of claim 3, wherein the photoresist pattern is rinsed using water.

5. The method of claim 3, wherein the spraying the stripping composition further comprises:
    moving the substrate in a first direction during spraying the stripping composition onto the photoresist pattern; and
    moving the substrate in a second direction opposed to the first direction during spraying the stripping composition onto the photoresist pattern.

6. The method of claim 1, wherein the layer comprises a gate layer having a first gate wiring layer and a second gate wiring layer,
    and wherein, the method further comprises:
    etching the second gate wiring layer using the photoresist pattern as a mask to form a second gate wiring layer pattern;
    removing the photoresist pattern using the stripping composition; and
    etching the first gate wiring layer to form a first gate wiring layer pattern.

7. The method of claim 6, wherein the gate layer comprises a Cr layer and an Al layer.

8. The method of claim 6, wherein the photoresist pattern is removed using the stripping composition after etching the first and second gate wiring layers using an etching gas.

9. The method of claim 8, wherein the etching gas comprises a chlorine gas.

10. The method of claim 6, wherein the photoresist pattern is removed by using the stripping composition after a contact hole is formed according to etching the first and second gate wiring layers.

11. A method of manufacturing a TFT substrate for an LCD device, the method comprising:
   forming a first gate wiring layer and a second gate wiring layer on a substrate;
   forming a first photoresist pattern including novolak;
   etching the second gate wiring layer using the first photoresist pattern as an etching mask;
   removing the first photoresist pattern using a stripping composition including an acetic acid and an ozone gas included in the acetic acid as a bubble form;
   etching the first gate wiring layer to form a gate pattern having a gate line, a gate pad and a gate electrode;
   forming a gate insulation layer on the substrate having the gate pattern;
   forming a semiconductor layer and a doped amorphous silicon layer on the gate insulation layer;
   forming a semiconductor layer pattern and an ohmic contact pattern by etching the semiconductor layer and the doped amorphous silicon layer;
   forming a conductive material on the semiconductor layer pattern and on the ohmic contact pattern;
   forming a data line, a source electrode and a drain electrode by etching the conductive material;
   forming a passivation layer on the data line, the source electrode and the drain electrode;
   forming a second photoresist pattern including novolak on the passivation layer;
   etching the passivation layer to form a contact hole partially exposing the drain electrode;
   removing the second photoresist pattern using a stripping composition including an acetic acid and an ozone gas included in the acetic acid as a bubble form; and
   forming and etching transparent conductive material layer to form a pixel electrode.

12. A method of manufacturing a TFT substrate for an LCD apparatus, the method comprising:
   forming a gate pattern having a gate line, a gate pad and a gate electrode on a substrate;
   forming a gate insulation layer on the substrate having the gate pattern;
   forming a semiconductor layer, an intermediate layer and a conductive layer on the gate insulation layer;
   forming a photoresist film including novolak on the conductive layer;
   exposing and developing the photoresist film to form a photoresist pattern having a first region formed in a channel region disposed between a source electrode and a drain electrode successively formed and a second region formed in a data wiring region successively formed, the first region having a thickness thinner than a thickness of the second region;
   etching the conductive layer, the intermediate layer and the semiconductor layer using the photoresist pattern as an etching mask to form a semiconductor layer pattern in the channel region, and to form the semiconductor layer pattern, an intermediate layer pattern and a conductive layer pattern in the data wiring region so that a data line, the source electrode and the drain electrode are formed in the channel and the data wiring regions;
   removing the photoresist pattern using a stripping composition including an acetic acid and an ozone gas included in the acetic acid as a bubble form;
   forming a passivation layer on the data line, the source electrode and the drain electrode;
   etching the passivation layer to form a contact hole partially exposing the drain electrode; and
   forming and etching transparent conductive material layer to form, a pixel electrode.

13. A method of manufacturing a TFT substrate for an LCD apparatus, the method comprising:
   forming a data wiring having a data line on a insulation substrate;
   forming a red color filter, a green color filter and a blue color filter on the substrate;
   forming a buffer layer covering the data wiring and the color filters;
   forming a gate wiring layer on the buffer layer;
   forming a photoresist pattern including novolak on the gate wiring layer;
   etching the gate wiring layer using the photoresist pattern as an etching mask to form a gate wiring having a gate line and a gate electrode;
   removing the photoresist pattern using a stripping composition including an acetic acid and an ozone gas included in the acetic acid as a bubble form;
   forming a gate insulation layer to cover the gate wiring;
   forming an ohmic contact layer pattern of an island shape and a semiconductor layer pattern on the gate insulation layer, and simultaneously forming a first contact hole through the gate insulation layer and the buffer layer to partially expose the data line;
   forming a pixel wiring including a source and a drain electrodes separately formed on the ohmic contact layer pattern, and a pixel electrode connected to the drain electrode, the source and the drain electrodes substantially including identical material; and
   removing an exposed portion of the ohmic contact layer pattern between the source electrode and the drain electrode to separate-the ohmic contact-layer pattern.

* * * * *